US012757386B2

(12) United States Patent
Lim et al.

(10) Patent No.: US 12,757,386 B2
(45) Date of Patent: Oct. 6, 2026

(54) SEMICONDUCTOR DEVICES HAVING LANDING PAD STRUCTURES

(71) Applicant: Samsung Electronics Co., Ltd., Suwon-si (KR)

(72) Inventors: Dongkyun Lim, Suwon-si (KR); Sunwoo Heo, Suwon-si (KR); Soobin Kim, Suwon-si (KR); Jinsub Kim, Suwon-si (KR); Seungyoung Seo, Suwon-si (KR); Taeyong Song, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 362 days.

(21) Appl. No.: 18/391,828

(22) Filed: Dec. 21, 2023

(65) Prior Publication Data

US 2024/0306376 A1 Sep. 12, 2024

(30) Foreign Application Priority Data

Mar. 6, 2023 (KR) ........................ 10-2023-0029111

(51) Int. Cl.
*H10B 12/00* (2023.01)

(52) U.S. Cl.
CPC ......... *H10B 12/485* (2023.02); *H10B 12/315* (2023.02); *H10B 12/482* (2023.02)

(58) Field of Classification Search
CPC .......................... H10B 12/485; H10B 12/0335
See application file for complete search history.

(56) References Cited

U.S. PATENT DOCUMENTS

| | | | |
|---|---|---|---|
| 5,014,112 | A | 5/1991 | Gelsomini |
| 5,082,802 | A | 1/1992 | Gelsomini |
| 5,102,819 | A | 4/1992 | Matsushita et al. |
| 5,111,259 | A | 5/1992 | Teng et al. |
| 5,258,096 | A | 11/1993 | Sandhu et al. |
| 5,622,883 | A | 4/1997 | Kim |
| 5,780,339 | A | 7/1998 | Liu et al. |
| 5,786,250 | A | 7/1998 | Wu et al. |
| 5,966,600 | A | 10/1999 | Hong |
| 6,010,933 | A | 1/2000 | Cherng |
| 6,077,743 | A | 6/2000 | Chen |
| 6,100,138 | A | 8/2000 | Tu |

(Continued)

FOREIGN PATENT DOCUMENTS

| | | |
|---|---|---|
| KR | 10-1996-0043221 | 12/1996 |
| KR | 10-0583964 B1 | 5/2006 |
| KR | 10-2022-0022644 A | 2/2022 |

*Primary Examiner* — Michele Fan
(74) *Attorney, Agent, or Firm* — Muir Patent Law, PLLC

(57) ABSTRACT

A semiconductor device includes a substrate including an active region; a cell gate structure disposed in the substrate, crossing the active region, and extending in a first horizontal direction; bitline structures crossing the cell gate structure and extending in a second horizontal direction intersecting the first horizontal direction; a contact plug disposed between the bitline structures; a landing pad structure disposed on the contact plug and including a lower landing pad and an upper landing pad on the lower landing pad, wherein the upper landing pad includes a cavity; a conductive pattern disposed in the cavity of the upper landing pad; and an insulating pattern structure in contact with one of the bitline structures and in contact with the landing pad structure.

20 Claims, 37 Drawing Sheets

(56) References Cited

U.S. PATENT DOCUMENTS

| | | | | |
|---|---|---|---|---|
| 6,121,082 | A | 9/2000 | Linliu et al. | |
| 6,150,278 | A | 11/2000 | Tan et al. | |
| 6,153,513 | A | 11/2000 | Lee et al. | |
| 6,218,271 | B1 | 4/2001 | Lee et al. | |
| 6,251,725 | B1 | 6/2001 | Chiou et al. | |
| 6,271,099 | B1 | 8/2001 | Lou | |
| 6,277,727 | B1 | 8/2001 | Kuo et al. | |
| 6,287,923 | B1 | 9/2001 | Lee | |
| 6,297,139 | B1 | 10/2001 | Lin | |
| 6,329,291 | B1 | 12/2001 | Wang et al. | |
| 6,342,419 | B1 | 1/2002 | Tu | |
| 6,429,068 | B1 | 8/2002 | Divakaruni et al. | |
| 6,756,627 | B1 | 6/2004 | Wu et al. | |
| 7,232,717 | B1 | 6/2007 | Choi et al. | |
| 2002/0032962 | A1 | 3/2002 | Hasler et al. | |
| 2002/0076895 | A1 | 6/2002 | Chien et al. | |
| 2002/0111006 | A1 | 8/2002 | Wu et al. | |
| 2002/0117759 | A1 | 8/2002 | Bauch et al. | |
| 2003/0003651 | A1 | 1/2003 | Divakaruni et al. | |
| 2004/0185657 | A1 | 9/2004 | Lee et al. | |
| 2004/0217407 | A1 | 11/2004 | Cho et al. | |
| 2004/0256675 | A1 | 12/2004 | McNeil | |
| 2005/0003646 | A1 | 1/2005 | Park et al. | |
| 2005/0012128 | A1 | 1/2005 | Bae | |
| 2005/0161718 | A1 | 7/2005 | Choi | |
| 2005/0179075 | A1 | 8/2005 | Lee et al. | |
| 2005/0230733 | A1 | 10/2005 | Lee et al. | |
| 2006/0040454 | A1 | 2/2006 | Park et al. | |
| 2006/0049445 | A1 | 3/2006 | Lee et al. | |
| 2006/0138561 | A1 | 6/2006 | Seo et al. | |
| 2008/0064161 | A1 | 3/2008 | Bae | |
| 2008/0224311 | A1 | 9/2008 | Isa et al. | |
| 2009/0101898 | A1 | 4/2009 | Kwon | |
| 2009/0114967 | A1 | 5/2009 | Lee et al. | |
| 2011/0042732 | A1 | 2/2011 | Wang et al. | |
| 2011/0053330 | A1 | 3/2011 | Iwasa | |
| 2011/0266602 | A1 | 11/2011 | Kim et al. | |
| 2014/0065767 | A1 | 3/2014 | Sugiyama et al. | |
| 2016/0020213 | A1 | 1/2016 | Kim et al. | |
| 2016/0204082 | A1 | 7/2016 | Sugiyama et al. | |
| 2016/0322337 | A1 | 11/2016 | Liang et al. | |
| 2018/0226290 | A1 | 8/2018 | Lee et al. | |
| 2019/0057933 | A1 | 2/2019 | Lin | |
| 2020/0176453 | A1 | 6/2020 | Chang et al. | |
| 2020/0303380 | A1 | 9/2020 | Wang et al. | |
| 2021/0118473 | A1 | 4/2021 | Seong et al. | |
| 2021/0375764 | A1* | 12/2021 | Song | H10B 12/315 |
| 2022/0052055 | A1 | 2/2022 | Chun | |
| 2022/0165736 | A1 | 5/2022 | Ryu et al. | |
| 2022/0181329 | A1* | 6/2022 | Choi | H10B 12/34 |
| 2023/0039823 | A1* | 2/2023 | Jeong | H10B 12/033 |

* cited by examiner

SEMICONDUCTOR DEVICES HAVING LANDING PAD STRUCTURES

CROSS-REFERENCE TO RELATED APPLICATION(S)

This application claims benefit of priority under 35 U.S.C. § 119 to Korean Patent Application No. 10-2023-0029111 filed on Mar. 6, 2023, in the Korean Intellectual Property Office, the disclosure of which is incorporated herein by reference in its entirety.

BACKGROUND

The present disclosure relates to a semiconductor device.

As demand for high performance, high speed, and/or multifunctionality of a semiconductor device has increased, integration density of semiconductor devices has increased. In manufacturing a semiconductor device having a fine pattern corresponding to the trend of high integration density of semiconductor devices, it may be necessary to implement patterns having a fine width or a fine spacing distance. Also, high integration density of a semiconductor device mounted on a semiconductor package may be necessary.

SUMMARY

A semiconductor device may include an upper landing pad having a cavity therein and a conductive pattern disposed in the cavity.

According to some embodiments, a semiconductor device includes a substrate including an active region; a cell gate structure disposed in the substrate, crossing the active region, and extending in a first horizontal direction; bitline structures crossing the cell gate structure and extending in a second horizontal direction intersecting the first horizontal direction; a contact plug disposed between the bitline structures; a landing pad structure disposed on the contact plug and including a lower landing pad and an upper landing pad on the lower landing pad, the upper landing pad including a cavity; a conductive pattern disposed in the cavity of the upper landing pad; and an insulating pattern structure in contact with one of the bitline structures and in contact with the landing pad structure.

According to an some embodiments of the present disclosure, a semiconductor device includes a substrate including an active region; a cell gate structure disposed in the substrate, crossing the active region, and extending in a first horizontal direction; bitline structures crossing the cell gate structure and extending in a second horizontal direction intersecting the first horizontal direction; a contact plug disposed between the bitline structures; a landing pad structure disposed on the contact plug and including a lower landing pad and an upper landing pad on the lower landing pad, the upper landing pad including a cavity; an insulating pattern structure in contact with one of the bitline structures and in contact with the landing pad structure; and a capacitor structure including a lower electrode disposed on the landing pad structure and electrically connected to the landing pad structure, a capacitor dielectric layer on the lower electrode, and an upper electrode on the capacitor dielectric layer, wherein a portion of the lower electrode extends into the cavity of the upper landing pad.

According to an some embodiments of the present disclosure, a semiconductor device includes a substrate including a cell region and a peripheral circuit region; a first active region disposed on the substrate in the cell region; a second active region disposed on the substrate in the peripheral circuit region; a cell gate structure disposed in the substrate in the cell region, crossing the first active region, and extending in a first horizontal direction; bitline structures crossing the cell gate structure and extending in a second horizontal direction intersecting the first horizontal direction; a contact plug disposed between the bitline structures; a landing pad structure disposed on the contact plug and including a lower landing pad and an upper landing pad on the lower landing pad, the upper landing pad including a cavity; a conductive pattern disposed in the cavity of the upper landing pad; a peripheral gate structure disposed on the substrate in the peripheral circuit region; a peripheral contact plug disposed adjacently to the peripheral gate structure and connected to the second active region; and a peripheral wiring layer on the peripheral contact plug.

BRIEF DESCRIPTION OF DRAWINGS

The above and other aspects, features, and advantages in the present disclosure will be more clearly understood from the following detailed description, taken in combination with the accompanying drawings, in which.

DETAILED DESCRIPTION

Figure 1:
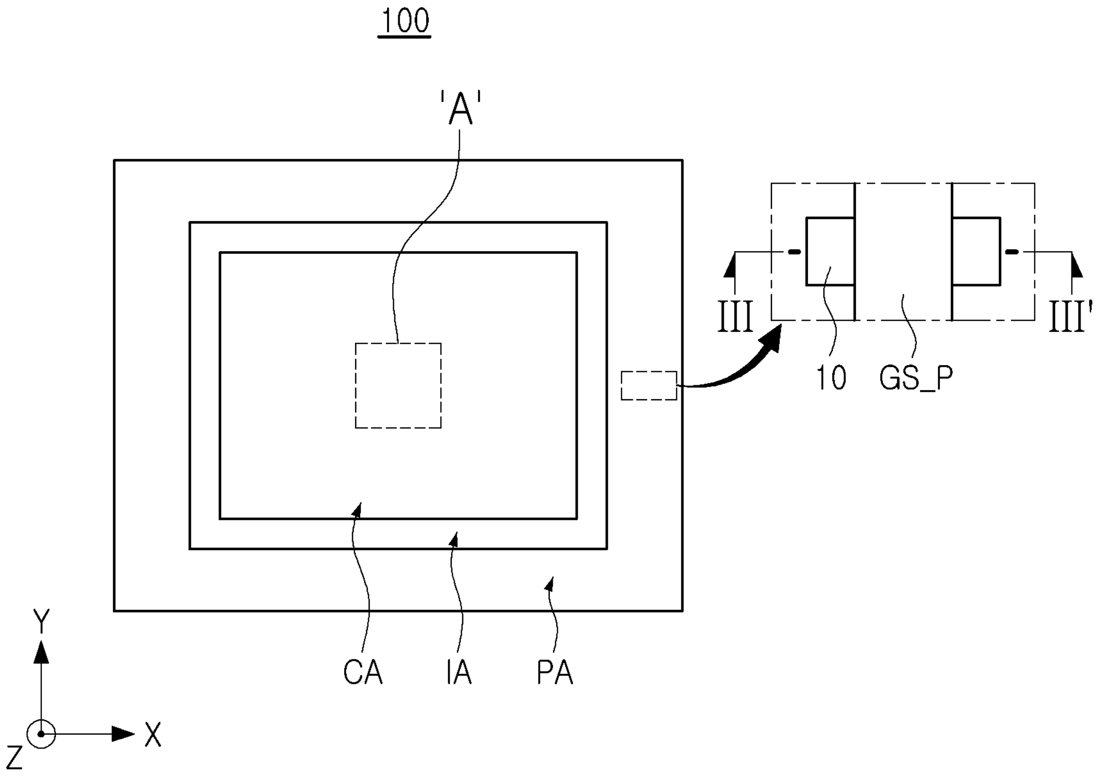
FIG. 1 is a plan view illustrating a semiconductor device according to an example embodiment of the present disclosure.

Hereinafter, example embodiments will be described with reference to the accompanying drawings.

Elements described in the singular herein may be provided in plural, as can be seen, for example, in the drawings. Thus, the description of a single element that is provided in plural should be understood to be applicable to the remaining plurality of elements unless context indicates otherwise. As used herein, the term "and/or" includes any and all combinations of one or more of the associated listed elements and may be abbreviated as "/".

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element (or using any form of the word "contact"), there are no intervening elements present at the point of contact.

As used herein, elements described as being “electrically connected” are configured such that an electrical signal can be passed from one element to the other. Therefore, a passive electrically conductive component (e.g., a wire, pad, internal electrical line, etc.) physically connected to a passive electrically insulative component (e.g., a prepreg layer of a printed circuit board, an electrically insulative adhesive connecting two devices, an electrically insulative underfill or mold layer, etc.) is not electrically connected to that component. Moreover, elements that are “directly electrically connected,” to each other are electrically connected through one or more passive elements, such as, for example, wires, pads, internal electrical lines, through vias, etc. As such, directly electrically connected components do not include components electrically connected through active elements, such as transistors or diodes. Directly electrically connected elements may be directly physically connected and directly electrically connected.

Terms such as “same,” “equal,” “planar,” or “coplanar,” as used herein when referring to orientation, layout, location, shapes, sizes, compositions, amounts, or other measures do not necessarily mean an exactly identical orientation, layout, location, shape, size, composition, amount, or other measure, but are intended to encompass nearly identical orientation, layout, location, shapes, sizes, compositions, amounts, or other measures within acceptable variations that may occur, for example, due to manufacturing processes. The term “substantially” may be used herein to emphasize this meaning, unless the context or other statements indicate otherwise. For example, items described as “substantially the same,” “substantially equal,” or “substantially planar,” may be exactly the same, equal, or planar, or may be the same, equal, or planar within acceptable variations that may occur, for example, due to manufacturing processes.

Ordinal numbers such as “first,” “second,” “third,” etc. may be used simply as labels of certain elements, steps, etc., to distinguish such elements, steps, etc. from one another. Terms that are not described using “first,” “second,” etc., in the specification, may still be referred to as “first” or “second” in a claim. In addition, a term that is referenced with a particular ordinal number (e.g., “first” in a particular claim) may be described elsewhere with a different ordinal number (e.g., “second” in the specification or another claim).

Embodiments described herein will be described referring to plan views and/or cross-sectional views by way of ideal schematic views. Accordingly, the exemplary views may be modified depending on manufacturing technologies and/or tolerances. Therefore, the disclosed embodiments are not limited to those shown in the views but include modifications in configuration formed on the basis of manufacturing processes. Therefore, regions exemplified in figures may have schematic properties, and shapes of regions shown in figures may exemplify specific shapes of regions of elements to which aspects of the invention are not limited.

Spatially relative terms, such as “beneath,” “below,” “lower,” “above,” “upper,” “top,” “bottom,” “front,” “rear,” and the like, may be used herein for ease of description to describe positional relationships, such as illustrated in the figures, for example. It will be understood that the spatially relative terms encompass different orientations of the device in addition to the orientation depicted in the figures. Unless otherwise indicated, directions may generally correspond with a plan view in which a horizontal plane is a plane parallel to the plane of the substrate and vertical is perpendicular to the plane of the substrate. Thickness of an element may refer to the thickness measured in a direction perpendicular to the top surface of the substrate. The level of an element refers to a distance measured in a direction perpendicular to the top surface of the substrate and, unless otherwise indicated, is relative to the bottom surface of the substrate. A higher level is a location having a greater distance from the bottom surface of the substrate and a lower level is a location having a smaller distance from the bottom surface of the substrate.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in the same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

FIG. 1 is a plan view illustrating a semiconductor device according to an example embodiment.

Referring to FIG. 1, a semiconductor device 100 according to an example embodiment may include a cell region CA, an interface region IA, and a peripheral circuit region PA. The peripheral circuit region PA may be disposed to surround the cell region CA (e.g., surround horizontally such as in the plan view of FIG. 1), and the interface region IA may be disposed between the cell region CA and the peripheral circuit region PA (e.g., disposed in a horizontal area between the cell region CA and the peripheral circuit region PA). The cell region CA may refer to a region in which memory cells of a dynamic random access memory (DRAM) device are disposed, and the peripheral circuit region PA may be a region in which word line drivers, sense amplifiers, row and column decoders, and control circuits are disposed. The interface region IA may be configured to electrically connect the cell region CA to the peripheral circuit region PA.

Figure 2:
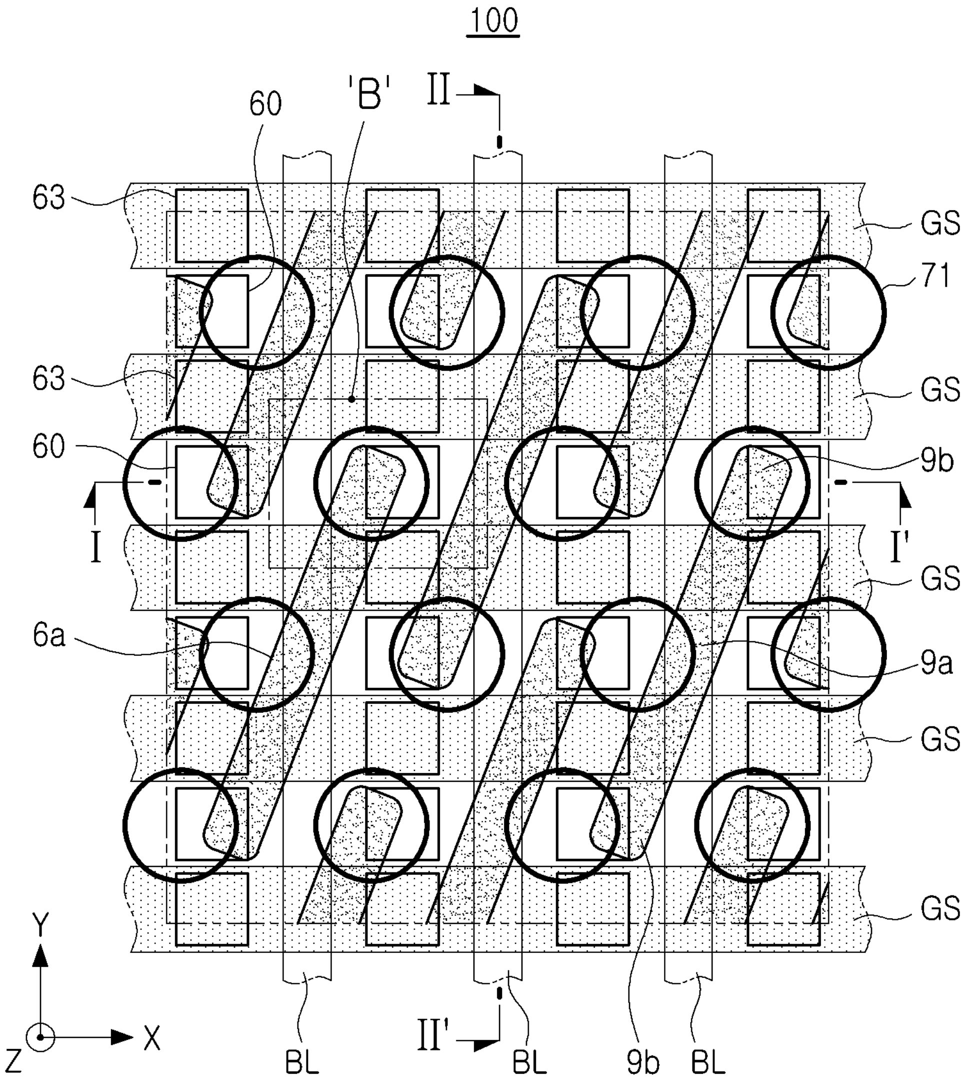
FIG. 2 is an enlarged view illustrating the semiconductor device illustrated in FIG. 1.
Figure 3A:
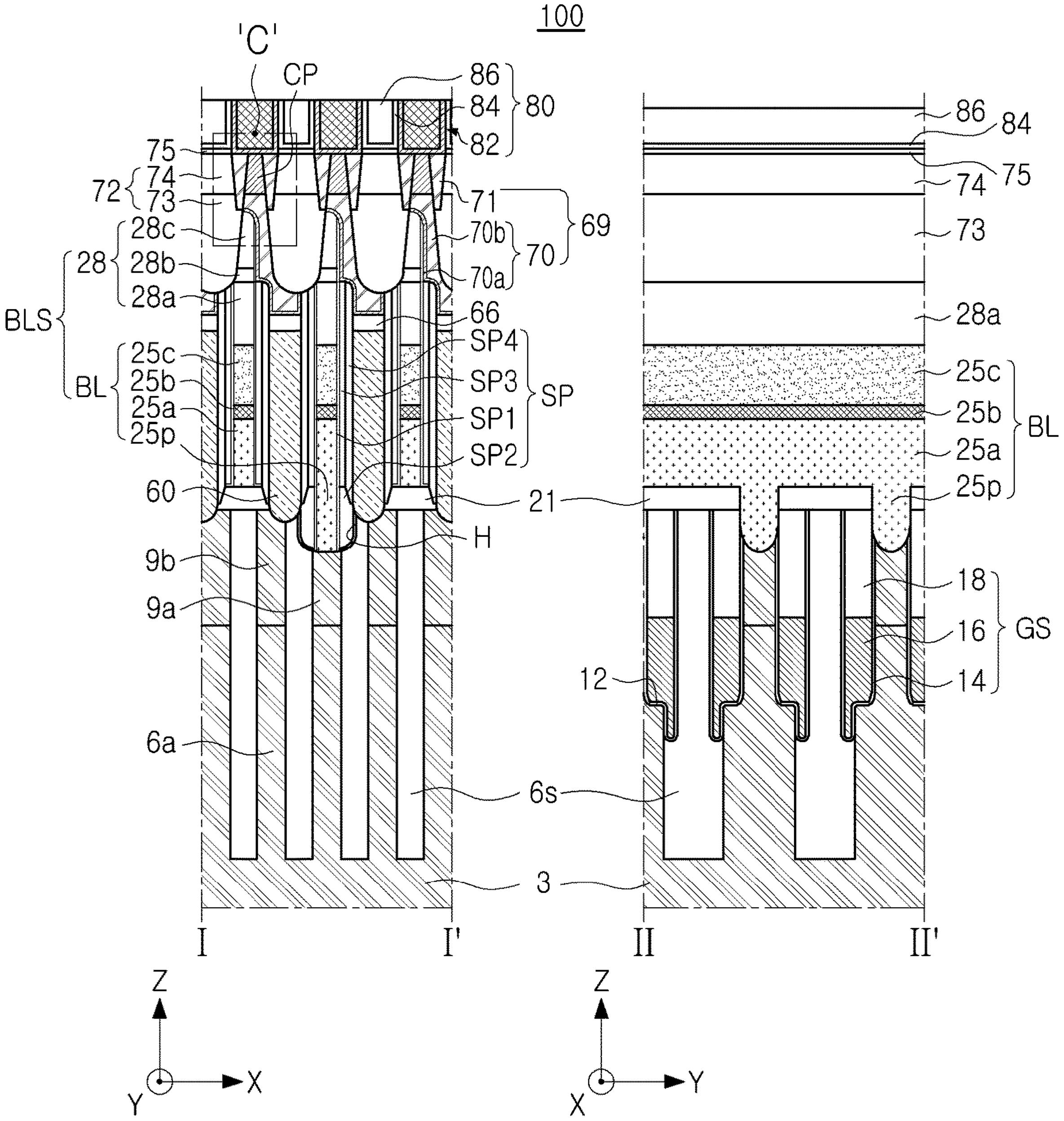
FIG. 3A is a vertical cross-sectional view illustrating the semiconductor device illustrated in FIG. 2 taken along line I-I' and II-II'.
Figure 3B:
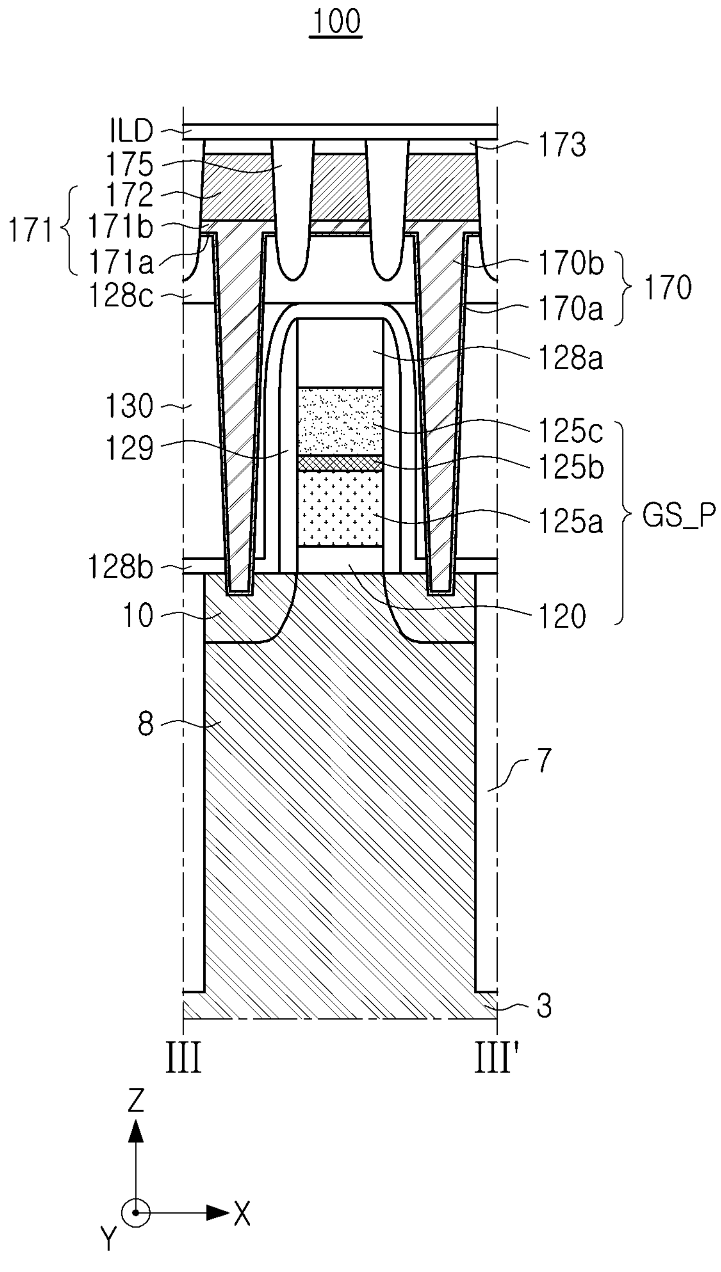
FIG. 3B is a vertical cross-sectional view illustrating the semiconductor device illustrated in FIG. 1 taken along line III-III'.

FIG. 2 is an enlarged view illustrating the semiconductor device illustrated in FIG. 1, corresponding to region A of FIG. 1. FIG. 3A is a vertical cross-sectional view illustrating the semiconductor device taken along lines I-I' and II-II' of FIG. 2. FIG. 3B is a vertical cross-sectional view illustrating the semiconductor device taken along line III-III' of FIG. 1.

Referring to FIGS. 2 and 3A, the semiconductor device 100 according to this example embodiment may include cell gate structure GS, a buffer layer 21, a bitline structure BLS, a spacer structure SP, a contact plug 60, a landing pad structure 69, an insulating pattern structure 72, and a capacitor structure 80 disposed on the substrate 3 in the cell region CA. The semiconductor device 100 may be a cell array of a dynamic random access memory (DRAM), but embodiments are not limited thereto.

Referring to FIG. 3B, the semiconductor device 100 may further include a peripheral gate structure GS_P, a first interlayer insulating layer 130, a peripheral contact plug 170, and a peripheral wiring layer 171 disposed on the substrate 3 in the peripheral circuit region PA.

The substrate 3 may be formed of and/or include a semiconductor material, such as a group IV semiconductor, a group III-V compound semiconductor, or a group II-VI compound semiconductor. For example, the group IV semiconductor may include silicon, germanium, or silicon-germanium. The substrate 3 may be a silicon substrate, a silicon on insulator (SOI) substrate, a germanium substrate, a germanium on insulator (GOI) substrate, a silicon-germanium substrate, or a substrate including an epitaxial layer.

In the cell region CA, the substrate 3 may include a first active region 6*a*, a first device isolation layer 6*s*, a first impurities region 9*a*, and a second impurities region 9*b*. The first device isolation layer 6*s* may be configured as an insulating layer extending downwardly from an upper surface of the substrate 3 and may define the first active region 6*a*. For example, the first active region 6*a* may correspond to a portion of an upper surface of the substrate 3 surrounded by the first device isolation layer 6*s*. As shown in the plan view of FIG. 1, the first active region 6*a* may have a horizontal bar shape having a minor axis and a major axis and may extend in directions inclined to the X-direction and Y-direction.

The first active region 6*a* may include first and second impurities regions 9*a* and 9*b* extending to a predetermined depth from an upper surface of the substrate 3. The first and second impurities regions 9*a* and 9*b* may be spaced apart from each other. The first and second impurities regions 9*a* and 9*b* may work as a source/drain region of a transistor. For example, for the first active region 6*a*, two cell gate structures GS may intersect the first active region 6*a*, and a drain region may be formed in a region of the first active region 6*a* between the two cell gate structures GS, and source regions may be formed in regions of the first active region 6*a* that are at opposite ends of the first active region 6*a* (i.e., not between the two cell gate structures GS) for the two cell gate structures GS. For example, the first impurities region 9*a* may correspond to the drain region, and the second impurities region 9*b* may correspond to the source region. The first and second impurities regions 9*a* and 9*b*, which may correspond to the drain region and the source region, may be formed by doping or ion implantation of substantially the same impurities, and may be referred to interchangeably depending on a circuit configuration of a finally formed transistor. The first and second impurities regions 9*a* and 9*b* may include impurities having a conductivity-type opposite to that of the substrate 3. For example, the substrate 3, which includes the first active regions 6*a*, may include P-type impurities, and the first and second impurities regions 9*a* and 9*b* may include N-type impurities.

The first device isolation layer 6*s* may extend downwardly from an upper surface of the substrate 3 and may define the first active regions 6*a*. The first device isolation layer 6*s* may surround the first active regions 6*a* and may isolate each of the first active regions 6*a* from each other. The first device isolation layer 6*s* may be formed of and/or include silicon oxide, silicon nitride, silicon oxynitride, or a combination thereof, and may include a single layer or a plurality of layers.

In the peripheral circuit region PA, the substrate 3 may further include a second device isolation layer 7, a second active region 8 and an impurities region 10. The second device isolation layer 7 may be an insulating layer extending downwardly from an upper surface of the substrate 3 and may define the second active region 8. For example, the second active region 8 may correspond to a portion of an upper surface of the substrate 3 surrounded by the second device isolation layer 7. The second active region 8 may include the impurities regions 10 extending from an upper surface of the substrate 3 to a predetermined depth. The impurities regions 10 may be spaced apart from each other. The second device isolation layer 7 may be formed of and/or include silicon oxide, silicon nitride, silicon oxynitride, or a combination thereof, and may include a single layer or a plurality of layers.

In the cell region CA, the cell gate structures GS may extend in the X-direction and may be spaced apart from each other in the Y-direction. Also, the cell gate structures GS may intersect the first active region 6*a*. For example, two cell gate structures GS may intersect the first active region 6*a*. The cell gate structure GS and the first and second impurities regions 9*a* and 9*b* may form transistors, which may be embodied as a buried channel array transistor (BCAT), but embodiments are not limited thereto.

In the cross-sectional view of FIG. 3A, the cell gate structures GS may be embedded in the substrate 3. For example, the cell gate structures GS may be disposed in a gate trench 12 formed in the substrate 3. The cell gate structure GS may include a gate dielectric layer 14, a gate electrode 16, and a gate capping layer 18 disposed in the gate trench 12. The gate dielectric layer 14 may be conformally formed on an internal wall of the gate trench 12. The gate electrode 16 may be disposed on a lower portion of the gate trench 12, and a gate capping layer 18 may be disposed on an upper portion of the cell gate structure GS and may fill the gate trench 12.

The gate dielectric layer 14 may be formed of and/or include silicon oxide or a material having a high dielectric constant. In some embodiments, the gate dielectric layer 14 may be formed by oxidizing the first active region 6*a* or may be formed by deposition. The gate electrode 16 may be formed of and/or include a conductive material, for example, polycrystalline silicon (Si), titanium (Ti), titanium nitride (TiN), tantalum (Ta), tantalum nitride (TaN), tungsten (W), tungsten nitride (WN), and aluminum (Al). The gate capping layer 18 may be formed of and/or include silicon nitride.

In the cell region CA, the buffer layer 21 may be disposed on the first active region 6*a*, the first device isolation layer 6*s*, and the cell gate structure GS. The buffer layer 21 may be formed of and/or include silicon oxide, silicon nitride, silicon oxynitride, or a combination thereof. The buffer layer 21 may be configured as a single layer or a plurality of layers.

In the cell region CA, the bitline structures BLS may extend in the Y-direction and may be spaced apart from each other in the X-direction. The bitline structure BLS may have a horizontal bar shape extending in the Y-direction. The bitline structure BLS may include a bitline BL and a bitline capping layer 28 on the bitline BL. The bitline BL may include a first conductive layer 25*a*, a second conductive layer 25*b*, and a third conductive layer 25*c* stacked in sequence on the buffer layer 21. The first conductive layer 25*a* may be formed of and/or include polysilicon. The second conductive layer 25*b* may be formed of and/or include a metal-semiconductor compound. The metal-semiconductor compound may be obtained by, for example, siliciding a portion of the first conductive layer 25*a*. For example, the metal-semiconductor compound may be formed of and/or include cobalt silicide (CoSi), titanium silicide (TiSi), nickel silicide (NiSi), tungsten silicide (WSi), or other metal silicides, or may include nitrides such as TiSiN. The third conductive layer 25*c* may be formed of and/or include a metal material such as titanium (Ti), tantalum (Ta), tungsten (W), and aluminum (Al). The bitline BL may further include a plug portion 25*p* disposed below the first conductive layer 25*a*, extending downwardly and in contact with the first impurities region 9*a*. The plug portion 25*p* may be disposed in a contact hole H formed on an upper surface of the substrate 3. In a plan view, such as the view of FIG. 2, the plug portion 25*p* may be in contact with a central portion of the first active region 6*a*. The plug portion 25*p* may electrically connect the first active region 6*a* to the bitline structure BLS. The plug portion 25*p* may be formed of and/or include the same material as that of the first conductive layer 25*a* (e.g., they may each have the same material composition).

The bitline capping layer 28 may include a first capping layer 28*a*, a second capping layer 28*b*, and a third capping layer 28*c* disposed on the bitline BL. A side surface of the first capping layer 28*a* may be coplanar with the first conductive layer 25*a*, the second conductive layer 25*b*, and the third conductive layer 25*c*. The first capping layer 28*a*, the second capping layer 28*b*, and the third capping layer 28*c* may each be formed of and/or include silicon oxide, silicon nitride, silicon oxynitride, or a combination thereof, and may include, for example, silicon nitride.

Spacer structures SP may be disposed on side surfaces of the bitline structures BLS and may extend in the Y-direction along the side surfaces of the bitline structures BLS. The spacer structures SP may each include a first spacer SP1, a second spacer SP2, a third spacer SP3, and a fourth spacer SP4 disposed on the side surface of the bitline structures BLS. The first spacer SP1 may be conformally disposed along the side surfaces of the bitline structure BLS and the contact hole H. The second spacer SP2 may be disposed on the first spacer SP1 and may fill the contact hole H. The third spacer SP3 may cover a side surface of the first spacer SP1, and the fourth spacer SP4 may cover a side surface of the third spacer SP3. The third spacer SP3 and the fourth spacer SP4 may cover an upper surface of the second spacer SP2. The first spacer SP1, the second spacer SP2, the third spacer SP3, and the fourth spacer SP4 may each be formed of and/or include silicon oxide, silicon nitride, silicon oxynitride, or a combination thereof. The spacer structure SP in the example embodiment is merely an example, and embodiments are not limited to the described material and the number of layers, each of which may be varied in other embodiments.

The contact plug 60 may be disposed between the bitline structures BLS and may be in contact with the spacer structures SP. As viewed in a plan view such as the view of FIG. 2, the contact plugs 60 may be disposed between adjacent pairs of the bitline structures BLS and between adjacent pairs of the cell gate structures GS.

A lower end of the contact plug 60 may be disposed at a level lower than a level of an upper surface of the substrate 3, and an upper surface of the contact plug 60 may be disposed at a level lower than a level of an upper end of the bitline structure BLS. The contact plug 60 may extend into the substrate 3, may be in contact with the second impurities region 9*b* of the first active region 6*a*, and may be electrically connected to the second impurities region 9*b*. The contact plug 60 may be formed of and/or include a conductive material such as, for example, polysilicon (Si), titanium (Ti), titanium nitride (TiN), tantalum (Ta), tantalum nitride (TaN), tungsten (W), tungsten nitride (WN), and aluminum (Al). In some embodiments, the contact plug 60 may include doped polysilicon and may include N-type impurities such as phosphorus (P), arsenic (As) and antimony (Sb).

The semiconductor device 100 may further include a fence structure 63 disposed between adjacent pairs of the bitline structures BLS. In a plan view, the fence structures 63 may overlap the cell gate structures GS in the vertical direction and may be alternately disposed with the contact plugs 60 in the Y-direction (e.g., may alternate between a fence structure 63 and a cell gate structure GS along the Y-direction). The fence structures 63 may spatially isolate the contact plugs 60 from each other and may electrically insulate the contact plugs 60 from each other. The fence structure 63 may have a bar or a column shape extending in a vertical direction (e.g., the Z-direction). Although not illustrated, a lower surface of the fence structure 63 may be in contact with the gate capping layer 18 of the cell gate structure GS. The fence structure 63 may be formed of and/or include an insulating material, for example, silicon nitride.

The semiconductor device 100 may further include a metal-semiconductor compound layer 66 disposed on an upper surface of the contact plug 60. The metal-semiconductor compound layer 66 may be in contact with a side surface of the spacer structure SP. The metal-semiconductor compound layer 66 may be formed by siliciding a portion of the contact plug 60 including polysilicon. The metal-semiconductor compound layer 66 may be formed of and/or include cobalt silicide (CoSi), titanium silicide (TiSi), nickel silicide (NiSi), tungsten silicide (WSi), or other metal silicide.

The semiconductor device 100 may further include a first insulating layer 128*a*, a gate spacer 129, a second insulating layer 128*b*, and a third insulating layer 128*c* in the peripheral circuit region PA. In the peripheral circuit region PA, a peripheral gate structure GS_P may be disposed on the second active region 8. The peripheral gate structure GS_P may have a structure similar to that of the bitline BL and may be formed of and/or include a material that is the same as or similar to that of the bitline BL. In some embodiments, the peripheral gate structure GS_P may have a shape having a greater width than that of the bitline BL.

The peripheral gate structure GS_P may include a peripheral gate dielectric layer 120, a first conductive layer 125*a*, a second conductive layer 125*b*, and a third conductive layer 125*c* stacked in sequence on the substrate 3. The peripheral gate dielectric layer 120 may be formed of and/or include silicon oxide, silicon nitride, or a high-k material. The high-K material may refer to a dielectric material having a higher dielectric constant than that of silicon oxide. The first conductive layer 125*a*, the second conductive layer 125*b*, and the third conductive layer 125*c* of the peripheral gate structure GS_P may include the same material as those of the first conductive layer 25*a*, the second conductive layer 25*b*, and the third conductive layer 25*c* of the bitline BL, respectively (e.g., they may each have the same material composition).

The first insulating layer 128*a* may be disposed on the peripheral gate structure GS_P and may cover an upper surface of the third conductive layer 125*c*. A horizontal width of the first insulating layer 128*a* may be the same as a horizontal width of the peripheral gate structure GS_P. The gate spacer 129 may cover a side surface of the peripheral gate structure GS_P. For example, the gate spacers 129 may be spaced apart from each other with the peripheral gate structure GS_P interposed therebetween and may cover side surfaces of the first conductive layer 125*a*, the second conductive layer 125*b*, the third conductive layer 125*c*, and the first insulating layer 128*a*.

The second insulating layer 128*b* may cover the substrate 3, the gate spacer 129, and the peripheral gate structure GS_P, and may be conformally formed. The first interlayer insulating layer 130 may partially cover the second insulating layer 128*b*. An upper surface of the first interlayer insulating layer 130 may be coplanar with an upper surface of the second insulating layer 128*b*. The third insulating layer 128*c* may cover the first interlayer insulating layer 130 and the second insulating layer 128*b*.

The gate spacer 129 may be formed of and/or include silicon oxide. The first insulating layer 128*a*, the second insulating layer 128*b* and the third insulating layer 128*c* may include the same materials as those of the first capping layer 28*a*, the second capping layer 28*b* and the third capping layer 28*c* of the bitline capping layer 28, respectively, and may include, for example, silicon nitride (e.g., they may each have the same material composition). The first interlayer insulating layer 130 may include silicon oxide, silicon nitride, silicon oxynitride, or a combination thereof, and may include, for example, silicon oxide.

Figure 4A:
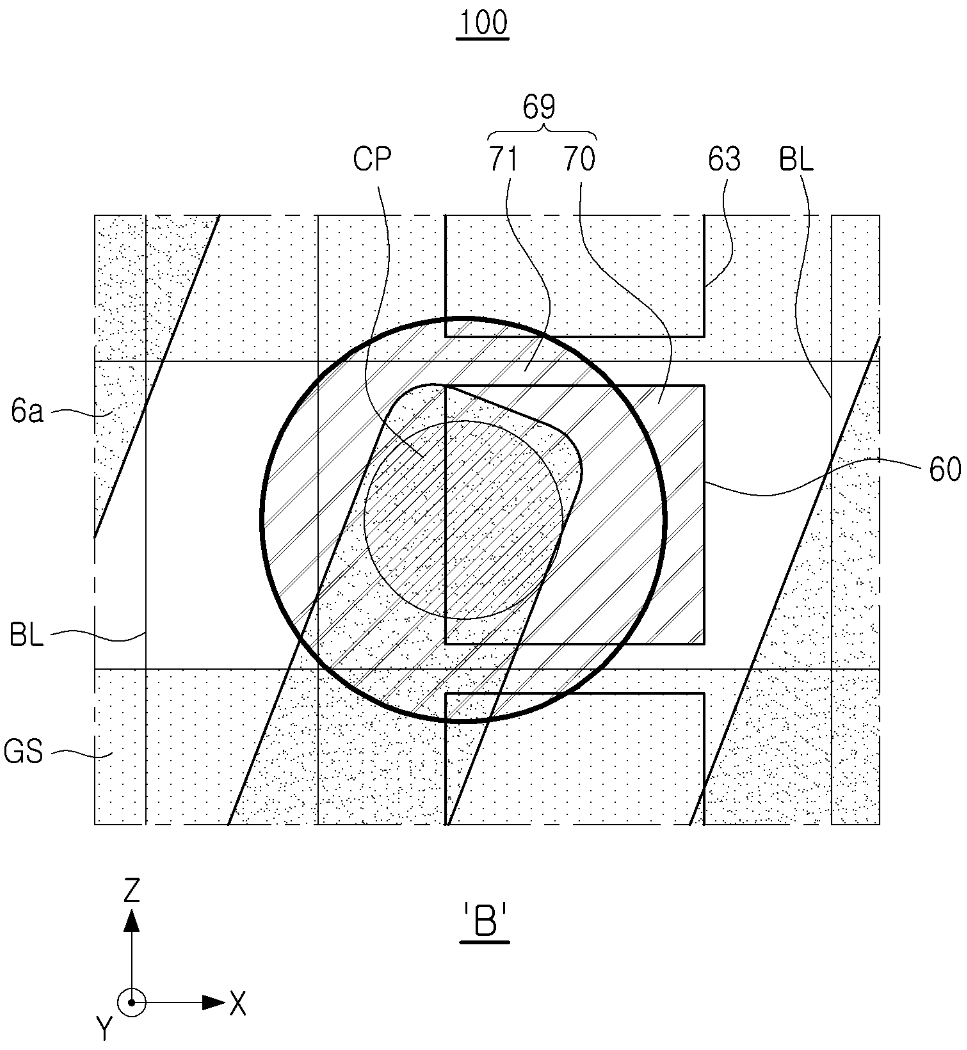
FIG. 4A is an enlarged view illustrating a portion of the semiconductor device illustrated in FIG. 2.
Figure 4B:
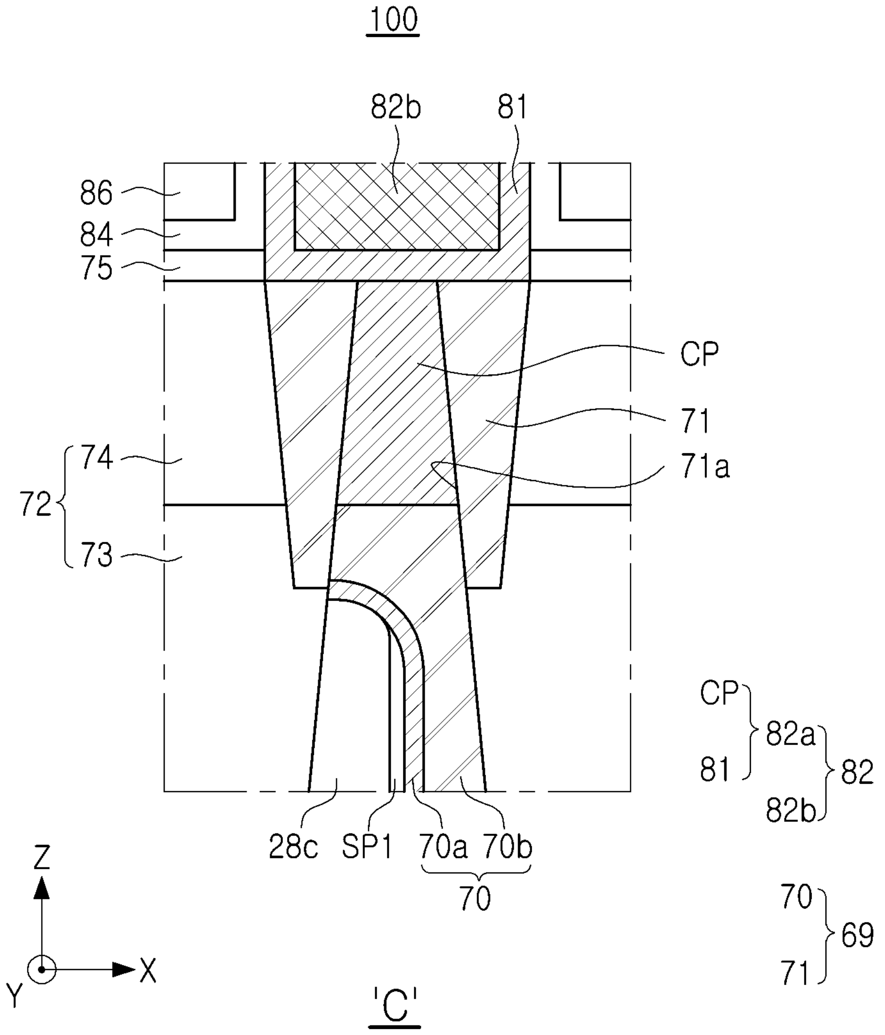
FIG. 4B is an enlarged view illustrating a portion of the semiconductor device illustrated in FIG. 3A.

FIG. 4A is an enlarged view illustrating a portion of the semiconductor device illustrated in FIG. 2, corresponding to region B. FIG. 4B is an enlarged view illustrating a portion of the semiconductor device illustrated in FIG. 3A, corresponding to region C.

Referring to FIGS. 2, 3A, 4A and 4B, the landing pad structure 69 may be disposed on the metal-semiconductor compound layer 66. The landing pad structure 69 may include a lower landing pad 70 and an upper landing pad 71. The upper landing pad 71 may be electrically connected to the lower landing pad 70, and the landing pad structure 69 may be electrically connected to the second impurities region 9*b* of the first active region 6*a* through the contact plug 60. The lower landing pad 70 may include a barrier layer 70*a* and a metal layer 70*b* on the barrier layer 70*a*. The barrier layer 70*a* may cover an upper surface of the metal-semiconductor compound layer 66 and may partially cover a side surface of the spacer structure SP. The barrier layer 70*a* may be formed of and/or include a metal nitride, such as at least one of titanium nitride (TiN), tantalum nitride (TaN), and tungsten nitride (WN). The metal layer 70*b* may be formed of and/or include at least one of a conductive material such as titanium (Ti), tantalum (Ta), tungsten (W), molybdenum (Mo), ruthenium (Ru), and aluminum (Al).

The upper landing pad 71 may be disposed on the lower landing pad 70. As shown in the plan view of FIG. 4A, the upper landing pad 71 may have a ring shape and may partially overlap the lower landing pad 70. As shown in the cross-sectional view of FIG. 4B, a portion of an inner side surface of the upper landing pad 71 may be in contact with a portion of the outer side surface of the lower landing pad 70. For example, the upper landing pad 71 may be in contact with a portion of the lower landing pad 70 covering the bitline structure BLS. The upper surface of the lower landing pad 70 may be disposed at a level higher than a level of the lower surface of the upper landing pad 71 and may be disposed on a level lower than a level of the upper surface of the upper landing pad 71.

The upper landing pad 71 may have a cylindrical shape including a cavity 71*a* therein. The cavity 71*a* may be defined by the inner side surface of the upper landing pad 71. The cavity 71*a* may be a recess or a hole in the upper landing pad 71, which may later be filled, as described below. The cavity 71*a* may extend from an upper surface of the upper landing pad 71 to a lower surface of the upper landing pad 71. A portion of the lower landing pad 70 may be disposed in the cavity 71*a*. In some embodiments, the upper landing pad 71 may have a tapered cylindrical shape. For example, an upper surface of the upper landing pad 71 may be wider (e.g., have a greater outer diameter) than a lower surface of the upper landing pad 71, and an outer diameter of the upper landing pad 71 may increase upwardly. Here, the "outer diameter of the upper landing pad 71" may refer to a maximum horizontal width of the upper landing pad 71 at a constant vertical level. In some embodiments, the cavity 71*a* of the upper landing pad 71 may have a tapered cylindrical shape. For example, a horizontal width of the cavity 71*a* may decrease upwardly. Here, the "horizontal width of the cavity 71*a*" may also be referred to as an inner diameter of the upper landing pad 71.

The upper landing pad 71 may be formed of and/or include the same material as that of the metal layer 70*b* of the lower landing pad 70 (e.g., they may each have the same material composition). For example, the upper landing pad 71 may be formed of and/or include at least one of titanium (Ti), tantalum (Ta), tungsten (W), molybdenum (Mo), ruthenium (Ru), and aluminum (Al).

In the cell region CA, a conductive pattern CP may be disposed in the landing pad structure 69 and may be electrically connected to the landing pad structure 69. For example, the conductive pattern CP may be disposed in the cavity 71*a* of the upper landing pad 71 and may be in contact with an internal side surface of the upper landing pad and/or an upper surface of the lower landing pad 70. The upper surface of the conductive pattern CP may be coplanar with the upper surface of the upper landing pad 71, but embodiments are not limited thereto. The conductive pattern CP may have a tapered cylindrical shape. For example, a horizontal width (e.g., an outer diameter) of the conductive pattern CP may decrease upwardly. The conductive pattern CP may be formed of and/or include a material different from that of the upper landing pad 71. In some embodiments, the conductive pattern CP may be formed of and/or include at least one of titanium nitride (TiN), tantalum nitride (TaN), or tungsten nitride (WN.

In the cell region CA, the insulating pattern structure 72 may be disposed between the landing pad structures 69. The insulating pattern structure 72 may spatially isolate the landing pad structures 69 from each other and may electrically insulate the landing pad structures 69 from each other. The insulating pattern structure 72 may include a lower insulating pattern 73 and an upper insulating pattern 74. For example, the lower insulating patterns 73 may be disposed between the lower landing pads 70, and each of the lower insulating patterns 73 may be in contact with the lower landing pad 70 and the bitline structure BLS. In some embodiments, the upper surface of the lower insulating pattern 73 may be coplanar with the upper surface of the lower landing pad 70, but embodiments are not limited thereto. In some embodiments, the lower insulating pattern 73 may include a recess, and the recess may be in contact with the upper landing pad 71. For example, the lower insulating pattern 73 may be in contact with the lower surface of the upper landing pad 71 and may be in contact with a portion of the side surface of the upper landing pad. The upper insulating patterns 74 may be disposed between the upper landing pads 71. The upper insulating pattern 74 may be in contact with a side surface of the upper landing pad 71. The upper surface of the upper insulating pattern 74 may be coplanar with the upper surfaces of the upper landing pad 71 and the conductive pattern CP, but embodiments are not limited thereto.

The lower insulating pattern 73 and the upper insulating pattern 74 may be formed of and/or include silicon oxide, silicon nitride, silicon oxynitride, or a combination thereof. For example, the lower insulating pattern 73 and the upper insulating pattern 74 may be formed of and/or include silicon nitride.

Referring to FIG. 3B, in the peripheral circuit region PA, a peripheral contact plug 170 may be disposed adjacent to the peripheral gate structure GS_P and may be electrically connected to the second active region 8. For example, the peripheral contact plug 170 may penetrate through the third insulating layer 128*c*, the first interlayer insulating layer 130, and the second insulating layer 128*b* and may be in contact with the impurities region 10. The peripheral contact plug 170 may include a barrier layer 170*a* and a metal layer 170*b* on the barrier layer 170*a*.

The peripheral wiring layer 171 may be disposed on the peripheral contact plug 170 and may extend in a horizontal direction. The peripheral wiring layer 171 may include a barrier layer 171*a*, a metal layer 171*b* on the barrier layer 171*a*, and a conductive layer 172 on the metal layer 171*b*. The barrier layer 171*a* of the peripheral wiring layer 171 may be integrally formed with the barrier layer 170*a* of the peripheral contact plug 170, and the metal layer 171*b* of the peripheral wiring layer 171 may be integrally formed with the metal layer 170*b* of the peripheral contact plug 170. An upper surface of the metal layer 171*b* of the peripheral wiring layer 171 may be disposed at the same level as a level of the upper surface of the lower landing pad 70. An upper surface of the conductive layer 172 may be disposed on a level higher than a level of an upper surface of the conductive pattern CP. For example, a vertical thickness of the conductive layer 172 may be greater than a vertical thickness of the conductive pattern CP.

The barrier layer 170*a* of the peripheral contact plug 170 and the barrier layer 171*a* of the peripheral wiring layer 171 may be formed of and/or include the same material as that of the barrier layer 70*a* of the lower landing pad 70 (e.g., they may each have the same material composition). The metal layer 170*b* of the peripheral contact plug 170 and the metal layer 170*b* of the peripheral wiring layer 171 may be formed of and/or include the same material as that of the metal layer 70*b* of the lower landing pad 70 (e.g., they may each have the same material composition). The conductive layer 172 may be formed of and/or include the same material as that of the conductive pattern CP (e.g., they may each have the same material composition).

The semiconductor device 100 may further include an upper insulating layer 173 on the peripheral wiring layer 171, a peripheral insulating pattern 175 disposed between portions of the peripheral wiring layer 171, and a second interlayer insulating layer ILD on the upper insulating layer 173. An upper insulating layer 173 may cover portions of the peripheral wiring layer 171. The peripheral insulating pattern 175 may completely penetrate through the upper insulating layer 173 and the peripheral wiring layer 171 and may partially penetrate through the third insulating layer 128*c*. The peripheral insulating pattern 175 may electrically insulate portions of the peripheral wiring layer 171 from each other. The second interlayer insulating layer ILD may cover the upper insulating layer 173 and the peripheral insulating pattern 175.

The upper insulating layer 173 may be formed of and/or include the same material as that of the upper insulating pattern 74 (e.g., they may each have the same material composition). The peripheral insulating pattern 175 may include silicon nitride. The second interlayer insulating layer ILD may include silicon oxide.

Referring again to FIGS. 3A and 4B, in the cell region CA, the semiconductor device 100 may further include an etch stop layer 75 covering an upper surface of the insulating pattern structure 72. The capacitor structure 80 may be disposed on the landing pad structure 69 and the insulating pattern structure 72. The capacitor structure 80 may include a lower electrode 82, a capacitor dielectric layer 84, and an upper electrode 86. The lower electrode 82 may penetrate through the etch stop layer 75 and may be in contact with the upper surface of the landing pad structure 69. The lower electrode 82 may include a barrier liner 81 and a metal layer 82*b*, and the conductive pattern CP may be included in the lower electrode 82. For example, the conductive pattern CP and the barrier liner 81 may together form the barrier layer 82*a*, and the barrier layer 82*a* and the metal layer 82*b* may together form the lower electrode 82. The barrier liner 81 may be formed of and/or include the same material as that of the conductive pattern CP and may be electrically connected to the conductive pattern CP (e.g., they may each have the same material composition). Accordingly, the conductive pattern CP may function as the lower electrode 82.

The capacitor dielectric layer 84 may cover at least a portion of the lower electrode 82 and the etch stop layer 75, and the upper electrode 86 may cover at least a portion of the capacitor dielectric layer 84. The capacitor structure 80 may be electrically connected to the landing pad structure 69 and the contact plug 60. The metal layer 82*b* of the lower electrode 82 and the upper electrode 86 may be formed of and/or include at least one of a doped semiconductor, a metal nitride, a metal, and a metal oxide. The metal layer 82*b* of the lower electrode 82 and the upper electrode 86 may be formed of and/or include, for example, at least one of polycrystalline silicon, titanium nitride (TiN), tungsten (W), titanium (Ti), ruthenium (Ru), and tungsten nitride (WN). The capacitor dielectric layer 84 may be formed of and/or include at least one of high dielectric constant materials such as zirconium oxide ($ZrO_2$), aluminum oxide ($Al_2O_3$), and hafnium oxide ($Hf_2O_3$).

As illustrated in FIG. 4B, the upper landing pad 71 of the landing pad structure 69 in some embodiments may have an upper surface that is wider than a lower surface (e.g., has a larger circumference). Accordingly, a contact area between the landing pad structure 69 and the lower electrode 82 may be increased at the upper surface and contact electrical resistance between the landing pad structure 69 and the lower electrode 82 may be reduced through the increased contact area. Also, since the conductive pattern CP working as the lower electrode 82 is disposed in the upper landing pad 71, the contact area between the lower electrode 82 and the landing pad structure 69 may be increased relative to an electrode contacting an end of a landing pad. For example, the surface area of the side surface of the conductive pattern CP contacting an internal surface of the upper landing pad 71 and the lower surface of the conductive pattern CP contacting an upper surface of the lower landing pad 70 may be greater than a lower surface area of a plain electrode. Accordingly, contact electrical resistance between the landing pad structure 69 and the lower electrode 82 may be further reduced relative to a plain electrode.

FIGS. 5A to 15B are vertical cross-sectional views illustrating process stages in a method of manufacturing a semiconductor device according to an example embodiment. Specifically, FIGS. 5A, 6A, 7A, 8A, 9A, 10A, 11A, 12A, 13A, 14A and 15A are vertical cross-sectional views illustrating cell region CA in various stages (e.g., after completion of various process stages) and correspond to FIG. 3A. FIGS. 5B, 6B, 7B, 8B, 9B, 10B, 11B, 12B, 13B, 14B and 15B are vertical cross-sectional views illustrating the peripheral circuit region Pa in various stages (e.g., after completion of various process stages) and correspond to FIG. 3B.

Figure 5A:
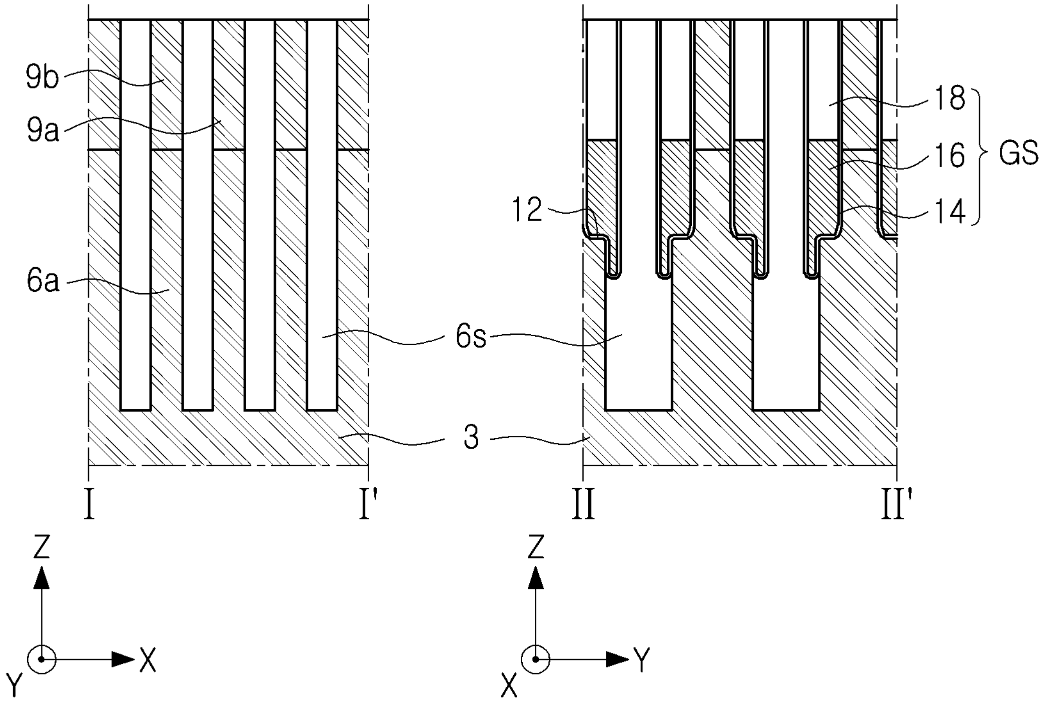
FIGS. 5A to 15B are vertical cross-sectional views illustrating processes of a method of manufacturing a semiconductor device in order according to an example embodiment of the present disclosure.
Figure 5B:
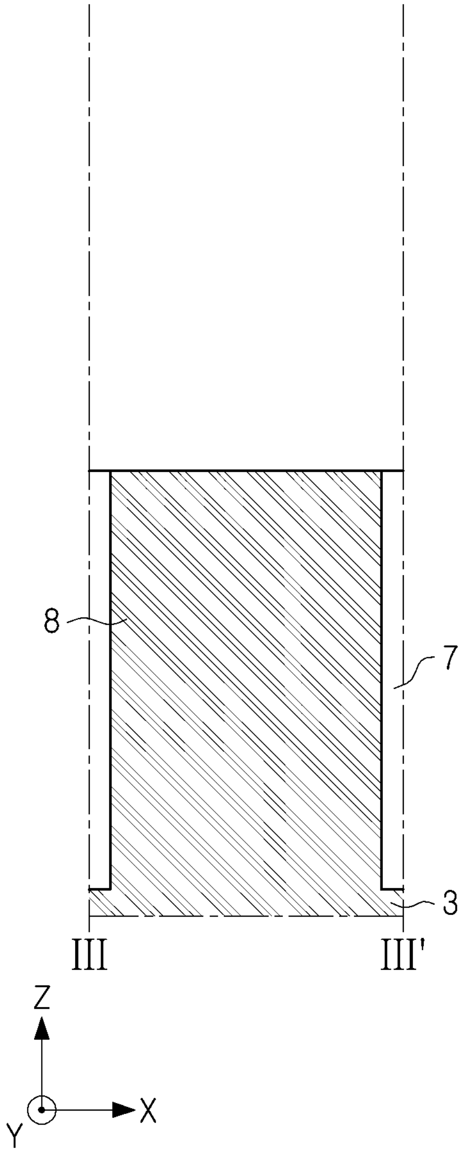

Referring to FIGS. 5A and 5B, a substrate 3 may be provided and a first device isolation layer 6*s* and a cell gate structure GS may be formed in the substrate 3 in the cell region CA. The first device isolation layer 6*s* may be formed by forming a trench on an upper surface of the substrate 3, filling the trench with an insulating material, and performing a planarization process such as etching the substrate 3 and the insulating material. The first device isolation layer 6*s* may define first active regions 6*a*. For example, the first active regions 6*a* may correspond to a portion of the upper surface of the substrate 3 surrounded by the first device isolation layer 6*s*. In a plan view, each of the first active regions 6*a* may have a bar shape having minor and major axes and each of the first active regions 6*a* may be spaced apart from each other. The first device isolation layer 6*s* may include a single layer of material or a plurality of layers of material.

In some embodiments, impurities regions 9*a* and 9*b* may be formed by implanting impurities into the substrate 3 before the first device isolation layer 6*s* is formed. However, in some embodiments, the impurities regions 9*a* and 9*b* may be formed after the first device isolation layer 6*s* is formed or in a different process.

Subsequently, gate trenches 12 may be formed by anisotropically etching the substrate 3 and in some embodiments, forming the gate trenches 12 may further include anisotropically etching a portion of the first device isolation layer 6*s*. The gate trenches 12 may extend in the X-direction and each gate trench 12 may cross a first active region 6*a* and the first device isolation layer 6*s*. A cell gate structure GS may be formed by forming a gate dielectric layer 14, a gate electrode 16 and a gate capping layer 18 in the gate trench 12. The gate dielectric layer 14 may be conformally formed on an internal wall of the gate trench 12. The gate electrode 16 may be formed by forming a conductive material on the gate dielectric layer 14 and recessing the conductive material (e.g., filling the gate trench 12 to a level lower than an upper surface of the substrate 3). The gate capping layer 18 may be formed by forming an insulating material on the gate electrode 16 to fill the gate trench 12 and performing a planarization process. In some embodiments, such as the embodiment illustrated in FIG. 5A, the gate trench 12 may be formed to have a deeper depth in the first device isolation layer 6*s* than in the first active region 6*a*.

In the peripheral circuit region PA, a second device isolation layer 7 may be formed in the substrate 3. In some embodiments, the second device isolation layer 7 may be formed simultaneously with the first device isolation layer 6*s*, but embodiments are not limited thereto. The second device isolation layer 7 may define a second active region 8. For example, the second active region 8 may correspond to a portion of the upper surface of the substrate 3 surrounded by the second device isolation layer 7.

Figure 6A:
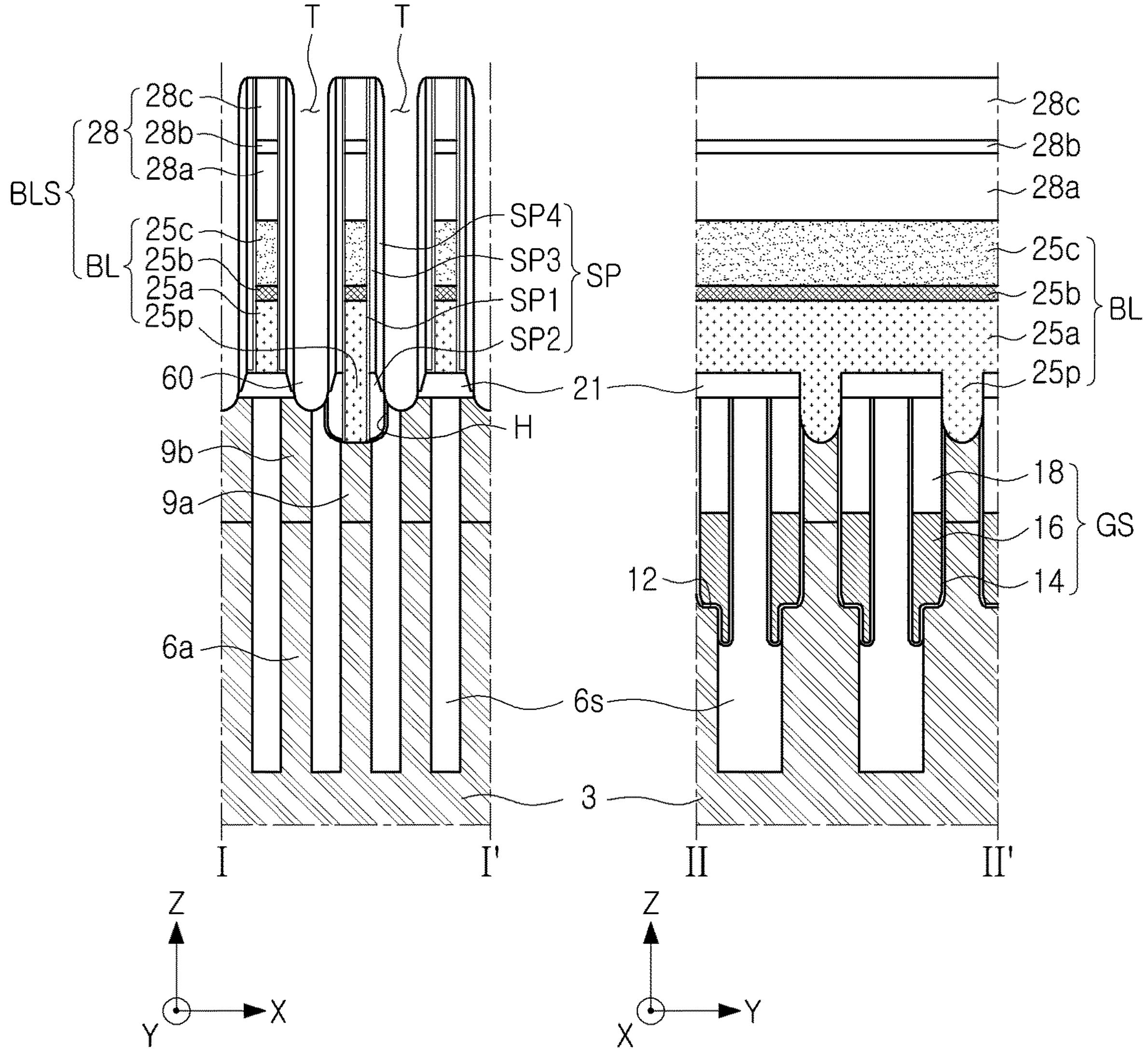
Figure 6B:
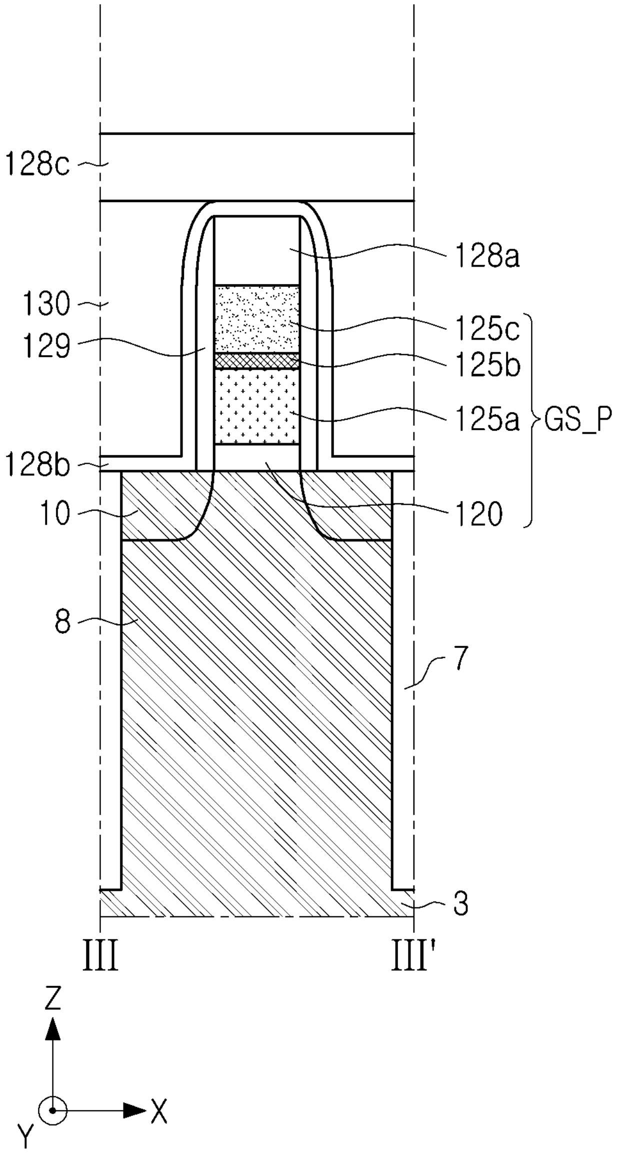

Referring to FIGS. 6A and 6B, a buffer layer 21, a bitline structure BLS, and a spacer structure SP may be formed on the substrate 3 in the cell region CA. The buffer layer 21 may be formed on an upper surface of the substrate 3, a first active region 6*a*, a first device isolation layer 6*s*, and a cell gate structure GS. The buffer layer 21 may include a single layer or a plurality of layers.

The bitline structure BLS may be formed on the buffer layer 21. The bitline structure BLS may be formed by etching the buffer layer 21 to expose the first active region 6*a* to form a contact hole H, stacking conductive material layers on the contact hole H, forming insulating material layers on the conductive material layers, and patterning the conductive material layers and the insulating material layers. For example, the conductive material layers and the insulating material layers may be patterned to form trenches extending in the Y-direction and spaced apart from each other in the X-direction. An upper surface of the first active region 6*a* may be partially exposed by the patterning process. The bitline structures BLS may extend in the Y-direction and may be spaced apart from each other in the X-direction.

The bitline structure BLS may include a bitline BL formed or and/or including a conductive material and a bitline capping layer 28 formed of and/or including an insulating material. The bitline BL may include a first conductive layer 25*a*, a second conductive layer 25*b*, and a third conductive layer 25*c* stacked in sequence. The first conductive layer 25*a* may include a plug portion 25*p* disposed in the contact hole H. The bitline capping layer 28 may include a first capping layer 28*a*, a second capping layer 28*b*, and a third capping layer 28*c* stacked in sequence.

The spacer structure SP may be formed on both side surfaces of the bitline structure BLS (e.g., a first spacer structure SP may be formed on a first side surface of the bitline structure BLS and a second spacer structure SP may be formed on a second side surface of the bitline structure BLS). The spacer structure SP may include a first spacer SP1, a second spacer SP2, a third spacer SP3, and a fourth spacer SP4. The first spacer SP1 may be formed by conformally depositing an insulating material along a side surface of the bitline structure BLS and an internal wall of the contact hole H. The second spacer SP2 may be formed by depositing an insulating material on the first spacer SP1 to fill the contact hole H. The third spacer SP3 and the fourth spacer SP4 may be formed by forming an insulating material to cover side surfaces of the second spacer SP2 and the third spacer SP3 and etching the insulating material. The spacer structure SP may extend in the Y-direction along a side surface of the bitline structure BLS.

After the spacer structure SP is formed, a process of etching the buffer layer 21 may be performed to expose an upper surface of the first active region 6*a*. A space between adjacent bitline structures BLS may be referred to as a trench T. For example, the trench T may be defined by side surfaces of adjacent spacer structures SP opposing each other and may extend in the Y-direction.

An impurities region 10 may be formed in the substrate 3 in the peripheral circuit region PA, and a peripheral gate structure GS_P, a first insulating layer 128*a*, a second insulating layer 128*b*, a third insulating layer 128*c*, a gate spacer 129, and a first interlayer insulating layer 130 may be formed on the substrate 3.

The peripheral gate structure GS_P may include a peripheral gate dielectric layer 120, a first conductive layer 125*a*, a second conductive layer 125*b* and a third conductive layer 125*c* stacked in sequence. The peripheral gate structure GS_P may be formed by forming a dielectric material on the substrate 3, stacking a conductive material on the dielectric material, and patterning the dielectric material and the conductive material. In some embodiments, the first conductive layer 125*a*, the second conductive layer 125*b*, and the third conductive layer 125*c* of the peripheral gate structure GS_P may be formed in the same process as a process of forming the first conductive layer 25*a*, the second conductive layer 25*b*, and the third conductive layer 25*c* of the bitline BL. The first conductive layer 125*a*, the second conductive layer 125*b*, and the third conductive layer 125*c* of the peripheral gate structure GS_P may be formed of and/or include the same material as those of the first conductive layer 25*a*, the second conductive layer 25*b*, and the third conductive layer 25*c* of the bitline BL, respectively (e.g., they may each have the same material composition).

After the peripheral gate structure GS_P is formed, a gate spacer 129 covering a side surface of the peripheral gate structure GS_P may be formed. The gate spacer 129 may be formed by forming an insulating material to cover the peripheral gate structure GS_P and anisotropically etching the insulating material. Also, after the peripheral gate structure GS_P is formed, the impurities region 10 may be formed in the substrate 3 using the peripheral gate structure GS_P as an ion implantation mask.

The first insulating layer 128*a* may cover the third conductive layer 125*c* of the peripheral gate structure GS_P and may be formed simultaneously, concurrently, or in parallel with the peripheral gate structure GS_P being formed. A side surface of the first insulating layer 128*a* may be covered by the gate spacer 129.

The second insulating layer 128*b* may be conformally formed along surfaces of the substrate 3, the second device isolation layer 7, the peripheral gate structure GS_P, and the gate spacer 129. The first interlayer insulating layer 130 may be formed by forming an insulating material to cover the second insulating layer 128*b* and performing a planarization process to expose an upper surface of the second insulating layer 128*b*. The third insulating layer 128*c* may be formed to cover upper surfaces of the second insulating layer 128*b* and the first interlayer insulating layer 130.

Figure 7A:
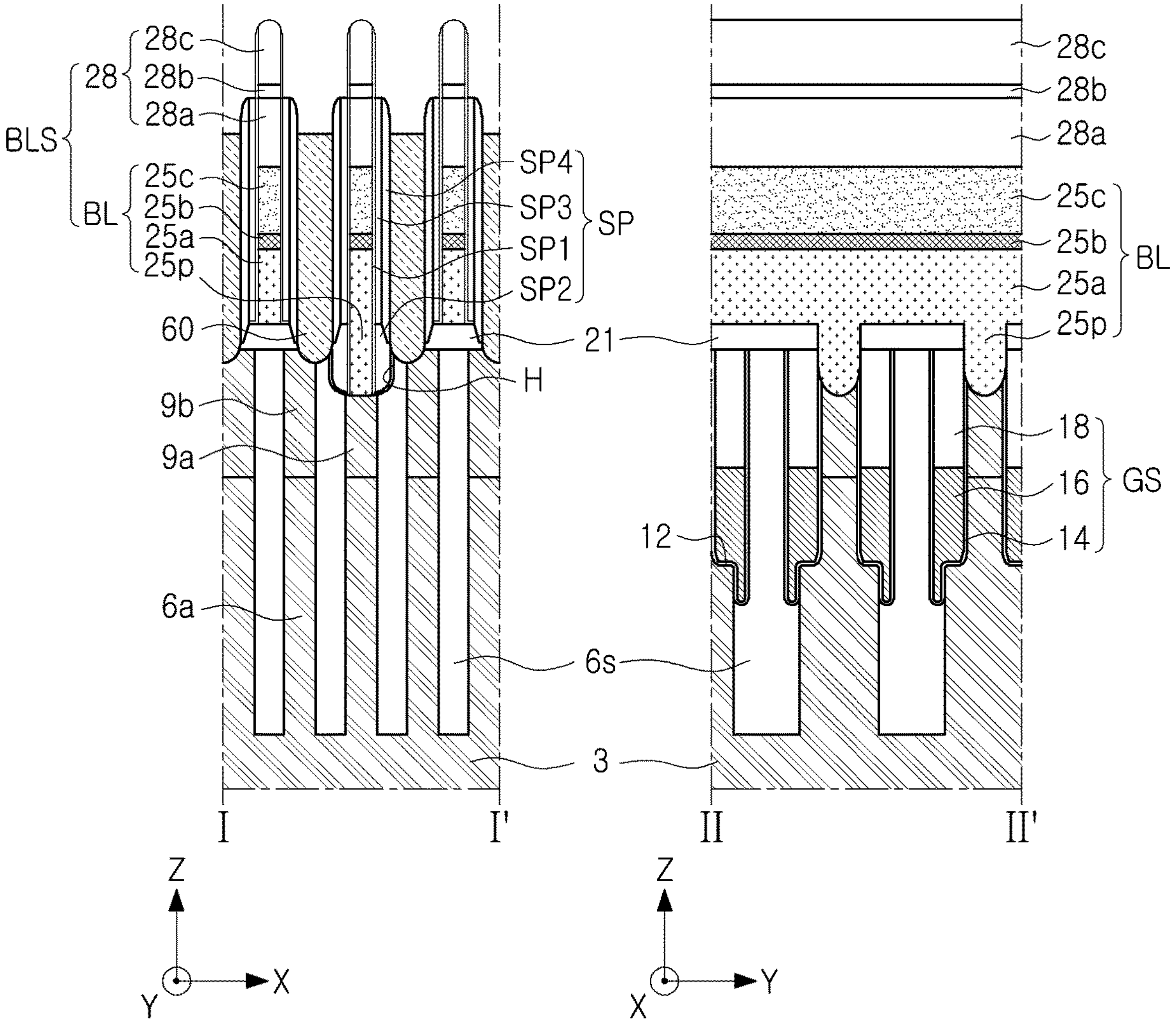
Figure 7B:
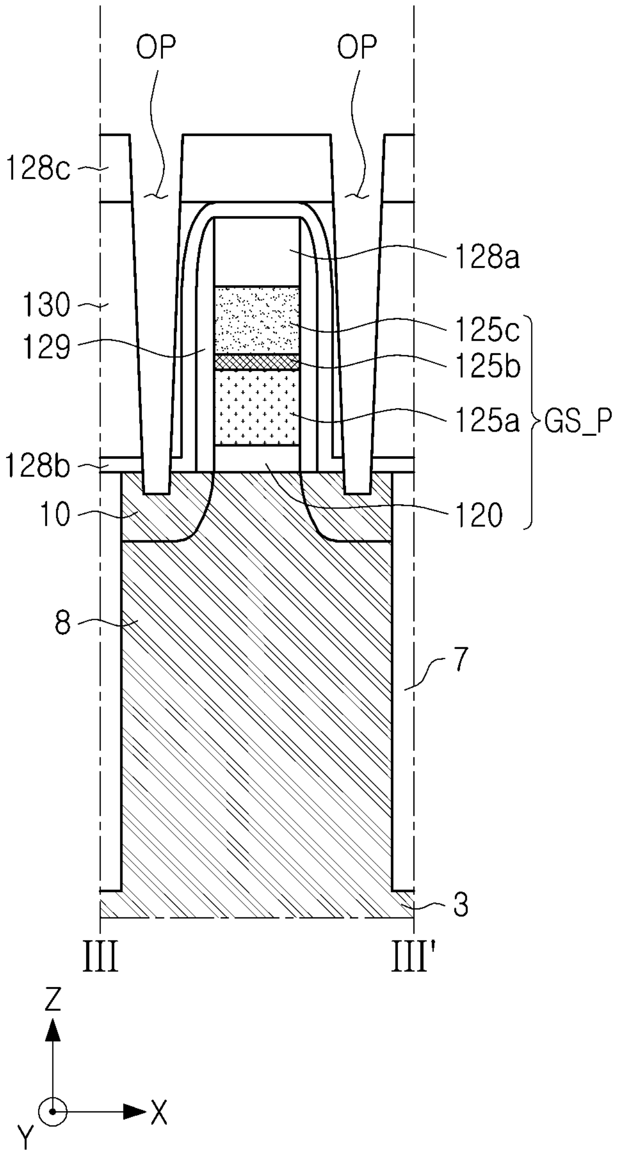

Referring to FIGS. 7A and 7B, a contact plug 60 may be formed in the trench T in the cell region CA. The contact plug 60 may be formed by filling the trench T with a conductive material to cover the spacer structure SP and etching back the conductive material (e.g., removing conductive material from the trench T to lower the upper surface of the contact plug 60). An upper surface of the contact plug 60 may be disposed at a level lower than a level of an upper end of the bitline structure BLS. The contact plug 60 may be in contact with the upper surface of the first active region 6*a* and may partially fill a space between adjacent spacer structures SP. Thereafter, a portion of the spacer structure SP may be etched by an etching process. For example, an upper portion of the first spacer SP1, the third spacer SP3 and the fourth spacer SP4 may be partially removed, which may expose a portion of the bitline structure BLS such as the second capping layer 28*b* and the third capping layer 28*c*. The contact plug 60 may be electrically connected to the first active region 6*a* (e.g., electrically connected to the second impurities region 9*b* of the first active region 6*a*.

In some embodiments, after the contact plug 60 is formed, the fence structure 63 illustrated in FIG. 2 may be formed. The fence structure 63 may be formed by removing a portion of the contact plug 60 and filling a space from which the portion of the contact plug 60 is removed with an insulating material. The fence structures 63 may be formed to overlap the cell gate structure GS in an area between adjacent bitline structures BLS in the vertical direction. The fence structures 63 may be disposed spaced apart from each other in the X-direction and the Y-direction. For example, the contact plugs 60 may be alternately disposed with the fence structures 63 in the Y-direction in an area between adjacent bitline structures BLS (e.g., may be disposed to alternate between a fence structure 63 and a contact plug 60 in the Y-direction). In some embodiments, the process of forming the fence structure 63 may be performed prior to the process of forming the contact plug 60.

Referring to FIG. 7*b*, an opening OP may be formed by anisotropically etching the second insulating layer 128*b*, the first interlayer insulating layer 130, and the third insulating layer 128*c* in the peripheral circuit region PA. The opening OP may be disposed adjacent to the peripheral gate structure GS_P and may expose an upper surface of impurities region 10.

Figure 8A:
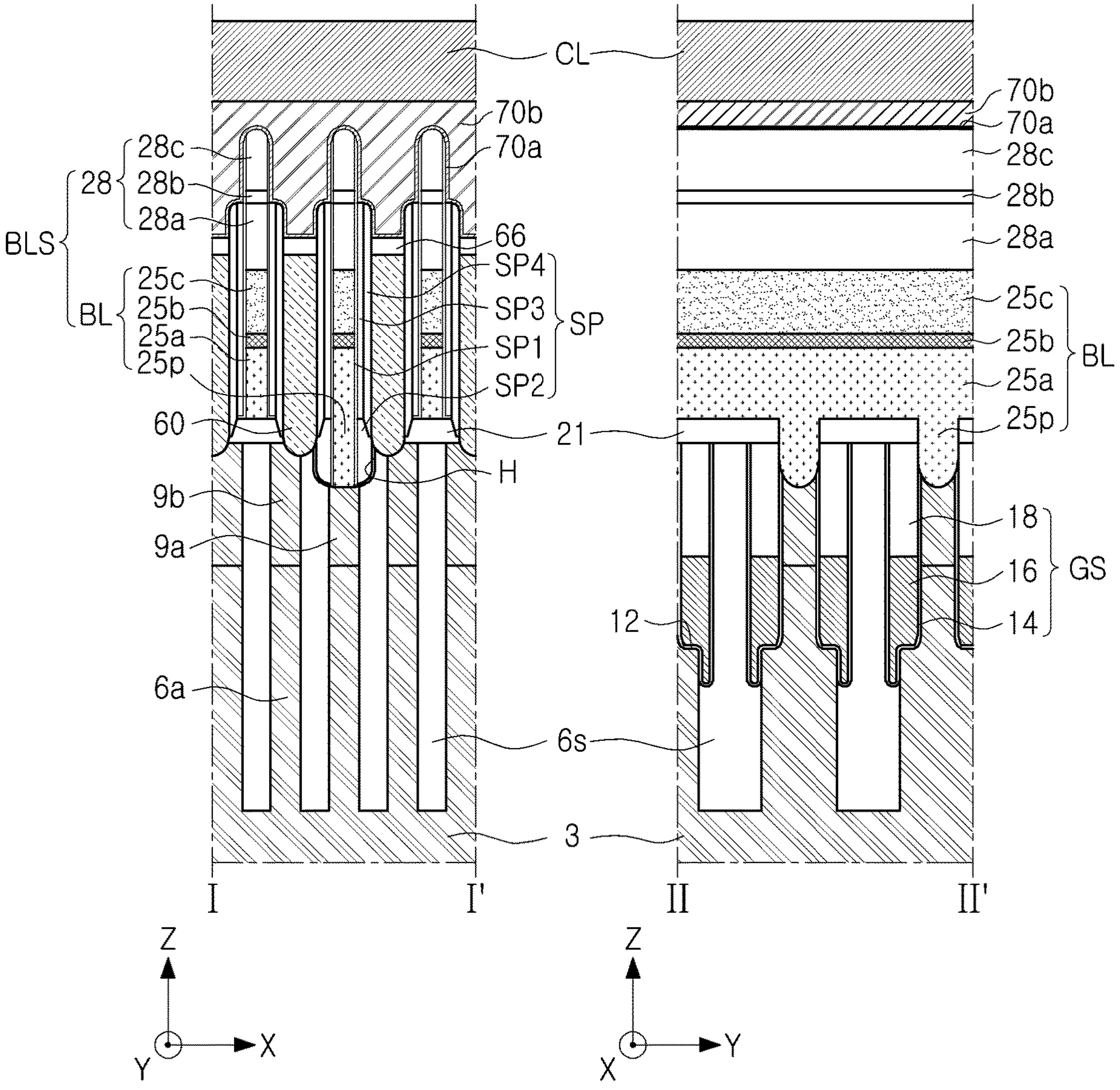
Figure 8B:
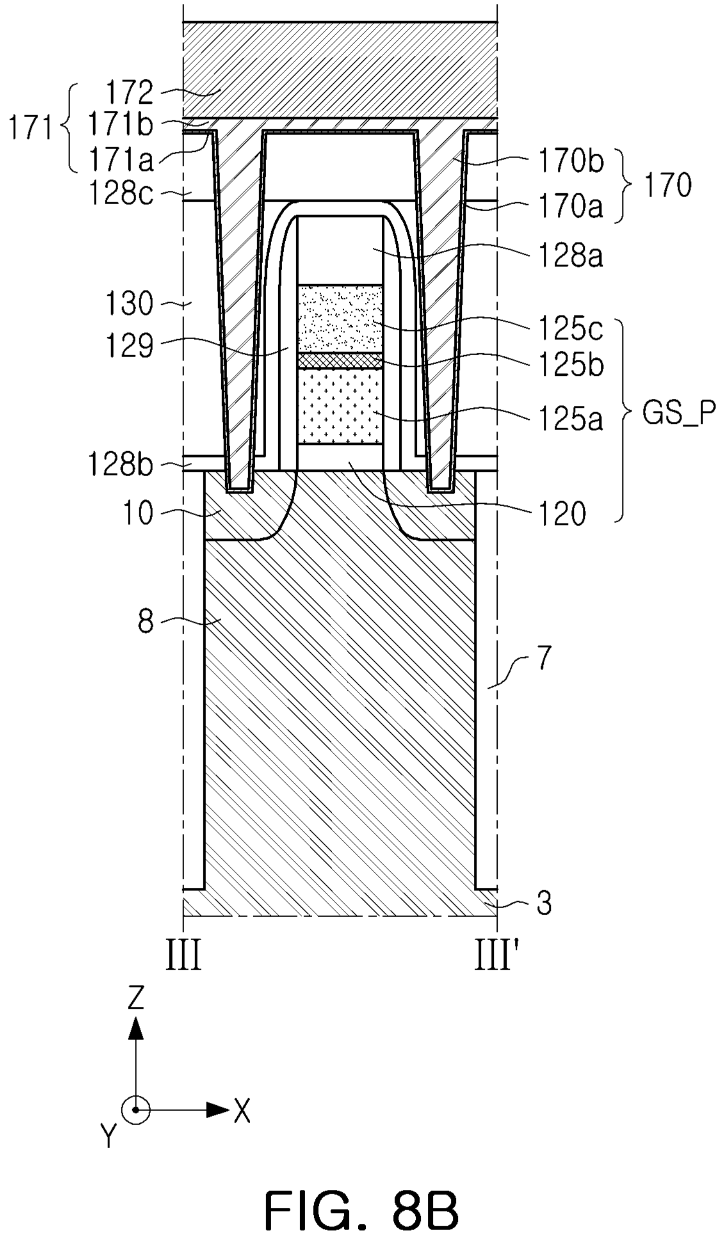

Referring to FIGS. 8A and 8B, a barrier layer 70*a*, a metal layer 70*b*, and a conductive layer CL may be formed in the cell region CA. The barrier layer 70*a* may extend along surfaces of the bitline structure BLS and the spacer structure SP, and the metal layer 70*b* may cover the barrier layer 70*a*. In some embodiments, the metal layer may be formed by a deposition process such as a chemical vaporization deposition (CVD) method, a physical vapor deposition (PVD) method, and an atomic layer deposition (ALD) method. For example, the metal layer 70*b* may be formed by a PVD method. The conductive layer CL may be formed to cover the metal layer 70*b*. The barrier layer 70*a* and the metal layer 70*b* may form a lower landing pad 70.

In some embodiments, a metal-semiconductor compound layer 66 may be formed between the contact plug 60 and the barrier layer 70*a*, and the barrier layer 70*a* may extend along an upper surface of the metal-semiconductor compound layer 66. The metal-semiconductor compound layer 66 may be formed by siliciding a portion of the contact plug 60.

Referring to FIG. 8*b*, A peripheral contact plug 170 and a peripheral wiring layer 171 may be formed in the peripheral circuit region PA. In some embodiments, the peripheral contact plug 170 and the peripheral wiring layer 171 may be formed simultaneously, concurrently, or in parallel with the barrier layer 70*a*, the metal layer 70*b*, and the conductive layer CL. For example, when the barrier layer 70*a* is formed in the cell region CA, a barrier material may be formed in the peripheral circuit region PA along an internal wall of the opening OP and the upper surface of the third insulating layer 128*c*. Among the barrier materials, a portion covering the internal wall of the opening OP may be referred to as a barrier layer 170*a*, and a portion covering an upper surface of the third insulating layer 128*c* may be referred to as a barrier layer 171*a*. When the metal layer 70*b* is formed in the cell region CA, a metal material may be formed on the barrier layer 170*a* and the barrier layer 171*a* in the peripheral circuit region PA. A portion of the metal materials covering the barrier layer 170*a* may be referred to as a metal layer 170*b*, and a portion covering the barrier layer 171*a* may be referred to as a metal layer 171*b*. The conductive layer 172 may cover the metal layer 171*b*. The barrier layer 170*a* and the metal layer 170*b* may form a peripheral contact plug 170. The barrier layer 171*a*, the metal layer 171*b*, and the conductive layer 172 may form the peripheral wiring layer 171. The peripheral wiring layer 171 may be electrically connected to the impurities region 10 through a peripheral contact plug 170.

Figure 9A:
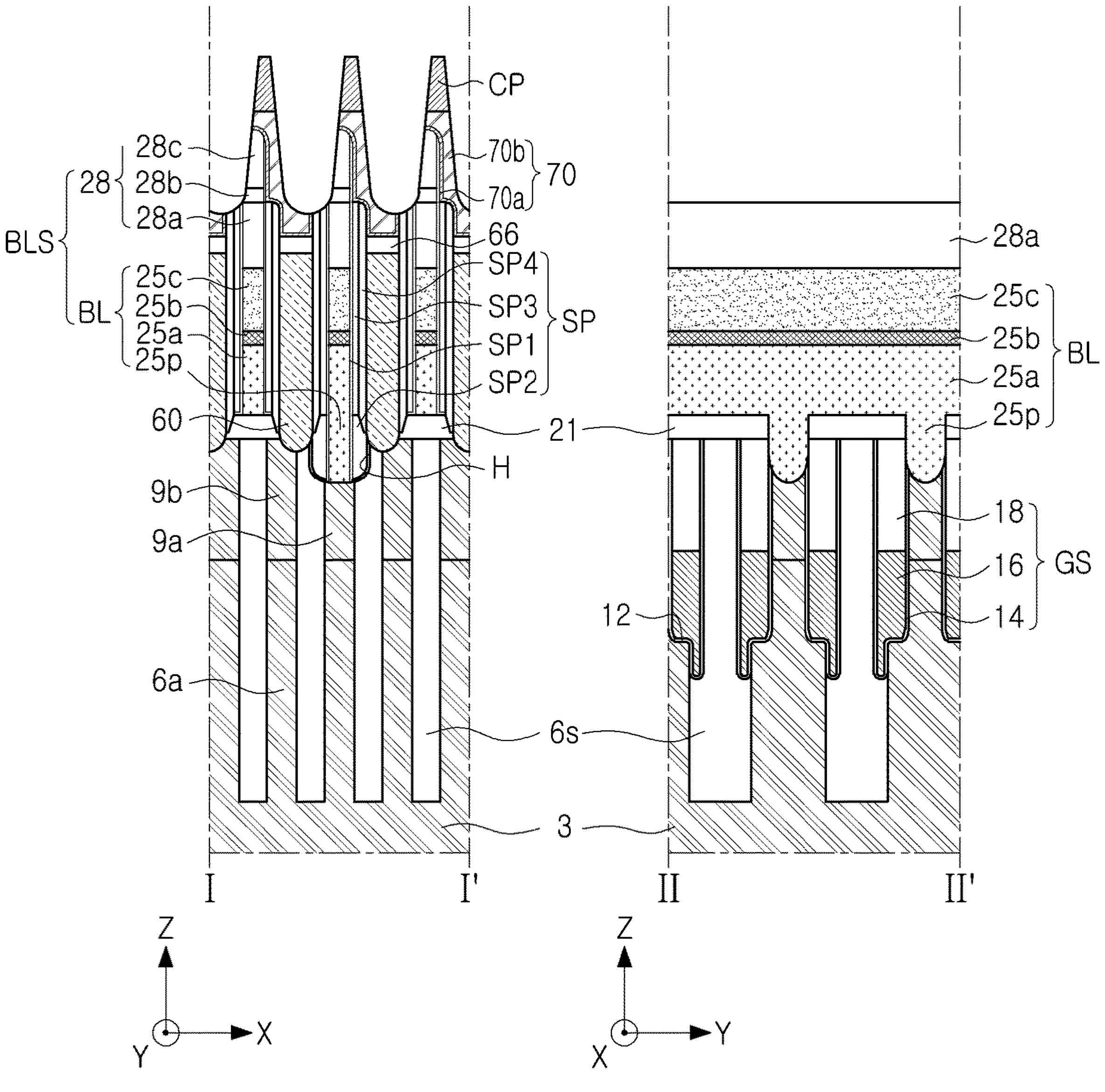
Figure 9B:
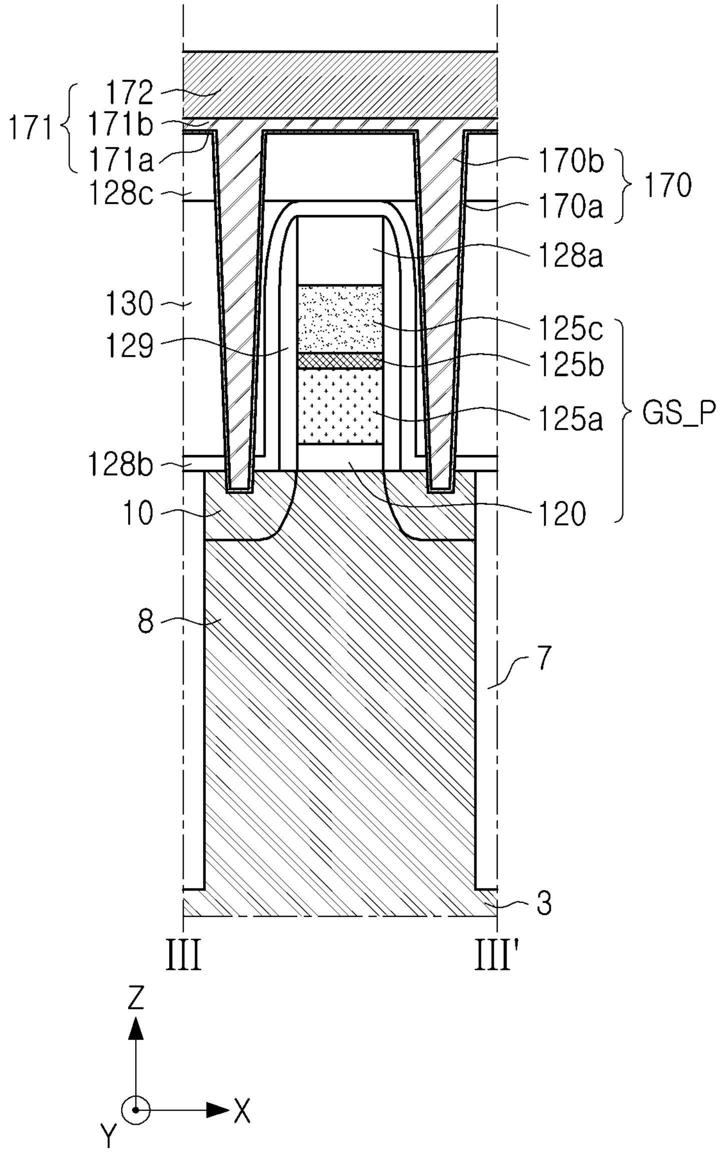

Referring to FIGS. 9A and 9B, a portion of the barrier layer 70*a*, the metal layer 70*b*, and the conductive layer CL may be removed by an etching process in the cell region CA. For example, the conductive pattern CP may be formed by patterning the conductive layer CL. An upper portion of the conductive pattern CP may be partially removed by the etching process, and a vertical thickness of the conductive pattern CP may be smaller than a vertical thickness of the conductive layer 172. A portion of the barrier layer 70*a* and the metal layer 70*b* (e.g., an upper portion) may be removed such that the bitline structure BLS and the spacer structure SP may be partially exposed. A conductive pattern CP may be disposed on the lower landing pad 70.

Referring to FIG. 9B, in the peripheral circuit region PA, an upper portion of the conductive layer 172 may be partially removed by the etching process (e.g., the etching process that partially exposes the bitline structure BLS and the spacer structure SP in the cell region CA), and a vertical thickness of the conductive layer 172 may be reduced. However, the conductive layer 172 may be etched more in the cell region CA, which has relatively high pattern density, the upper surface of the conductive layer 172 of the peripheral circuit region PA may be disposed at a level higher than a level of the upper surface of the conductive pattern CP of the cell region CA.

Figure 10A:
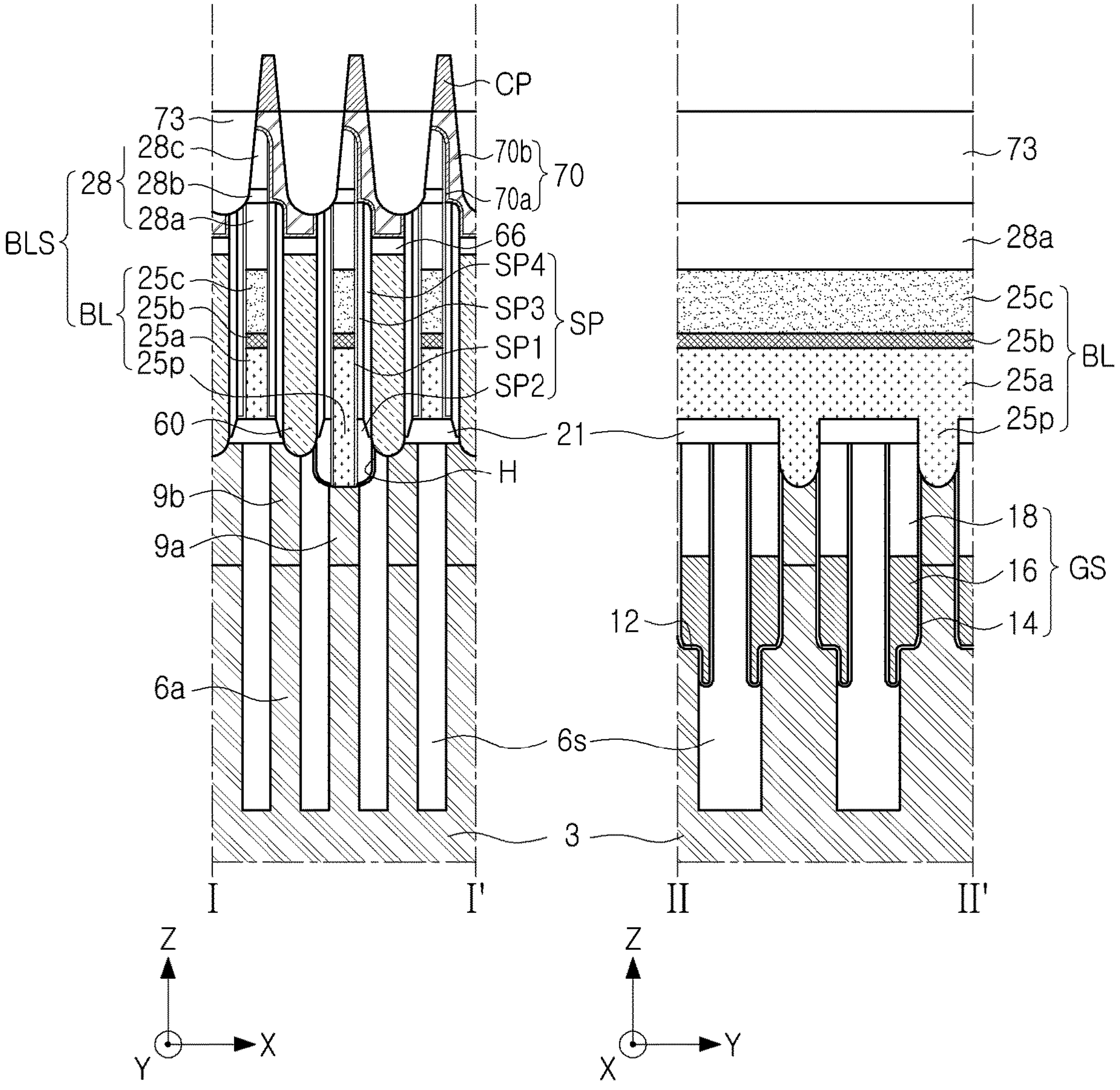
Figure 10B:
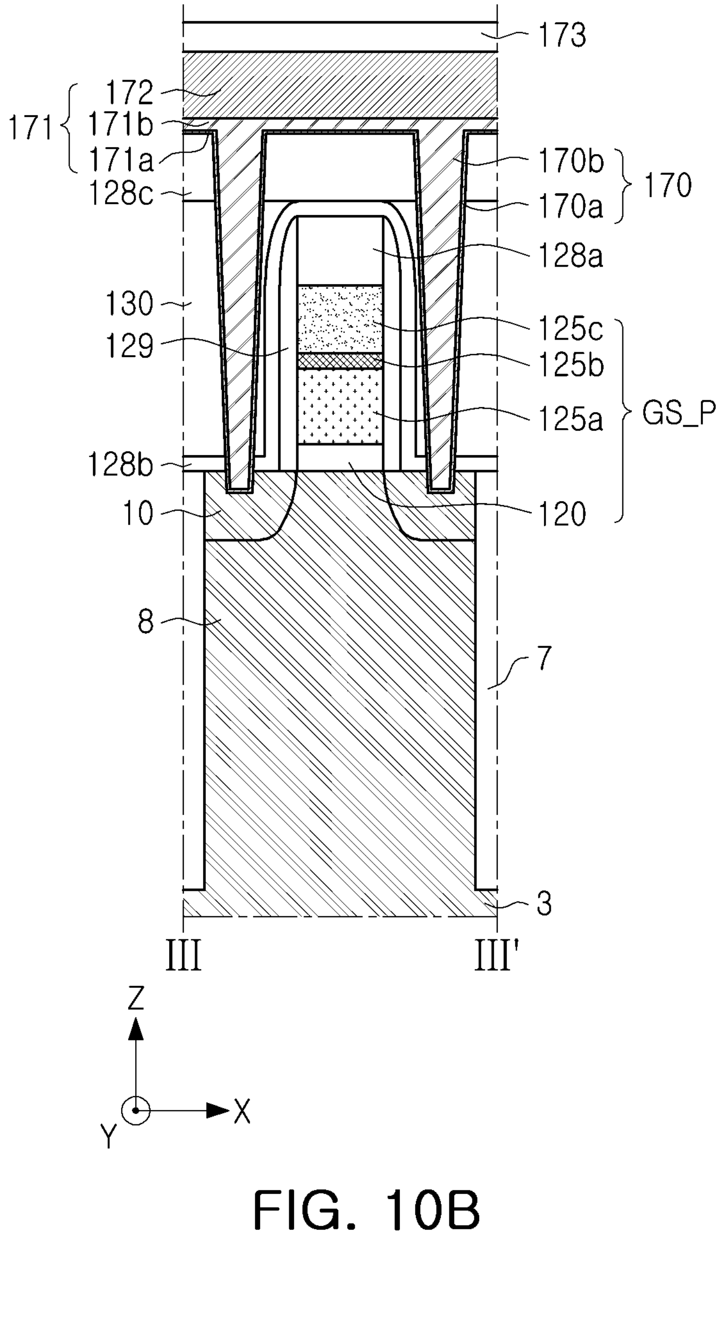

Referring to FIGS. 10A and 10B, a lower insulating pattern 73 may be formed in a space from which the barrier layer 70*a* and the metal layer 70*b* were removed in the cell region CA. The lower insulating pattern 73 may be formed by forming an insulating material to cover the bitline structure BLS, the spacer structure SP, the barrier layer 70*a*, the metal layer 70*b*, and the conductive pattern CP, and etching the insulating material to expose the conductive pattern CP. The upper surface of the lower insulating pattern 73 may be coplanar with the upper surface of the metal layer 70*b*, and may be a flat surface, but embodiments are not limited thereto. In some embodiments, the upper surface of the lower insulating pattern 73 may be disposed at a level higher or lower than a level of the upper surface of the metal layer 70*b* or may be a curved surface.

Referring to FIG. 10B, in the peripheral circuit region PA, the insulating material may be formed on the conductive layer 172. However, the insulating material on the conductive layer 172 may remain without being completely removed, and the insulating material remaining on the conductive layer 172 may be referred to as an upper insulating layer 173.

Figure 11A:
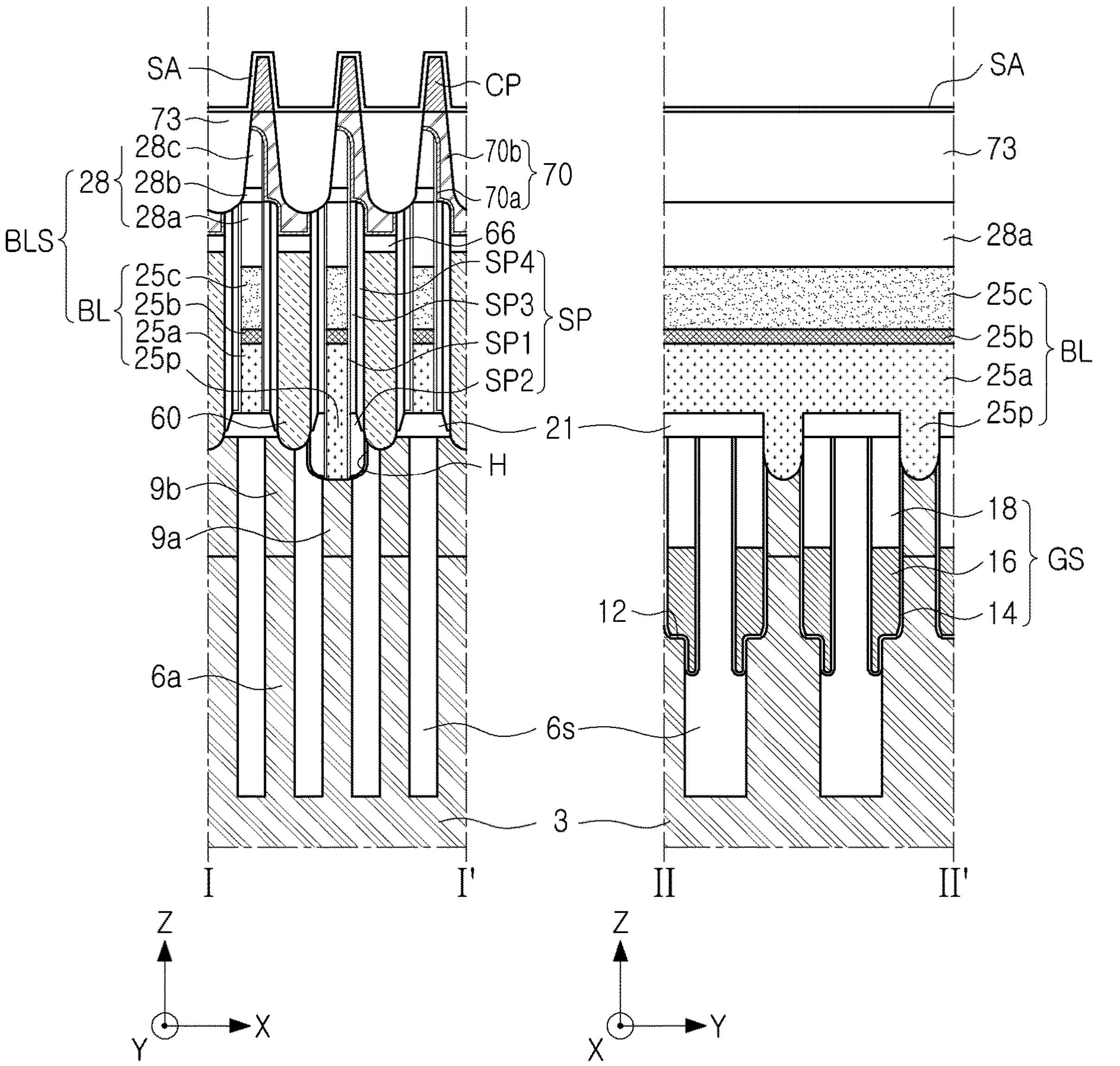
Figure 11B:
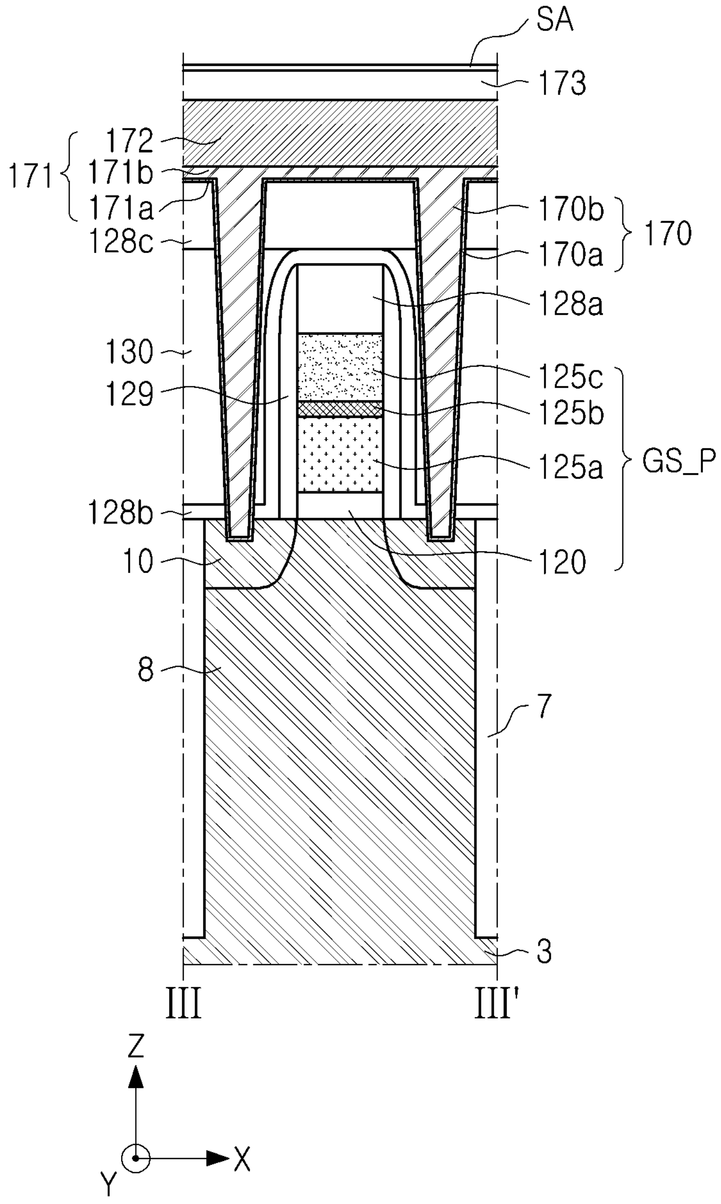

Referring to FIGS. 11A and 11B, a sacrificial layer SA may be formed. In the cell region CA, the sacrificial layer SA may cover the lower insulating pattern 73 and the conductive pattern CP and may be conformally formed. In the peripheral circuit region PA, the sacrificial layer SA may cover the upper insulating layer 173.

Figure 12A:
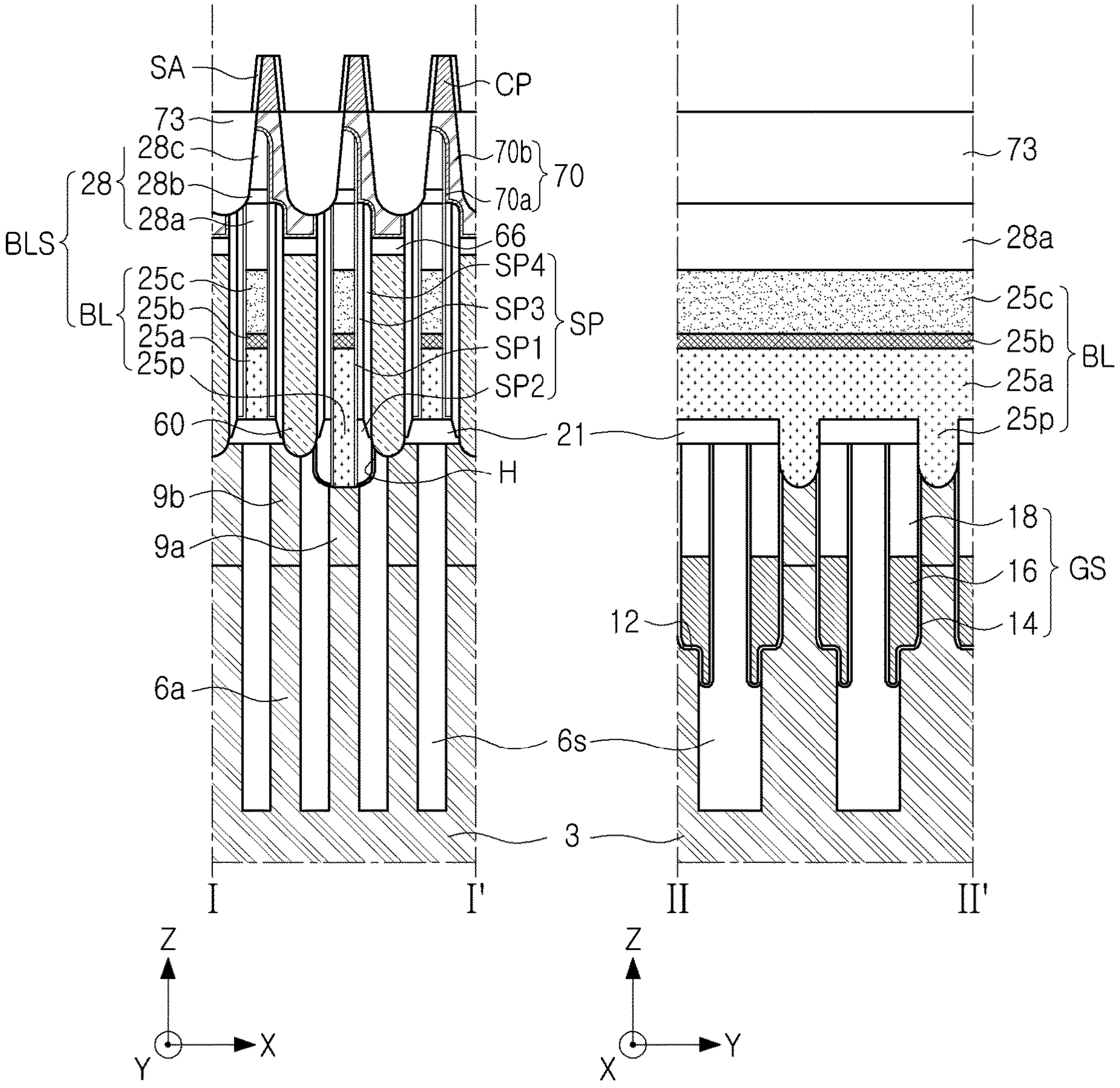
Figure 12B:
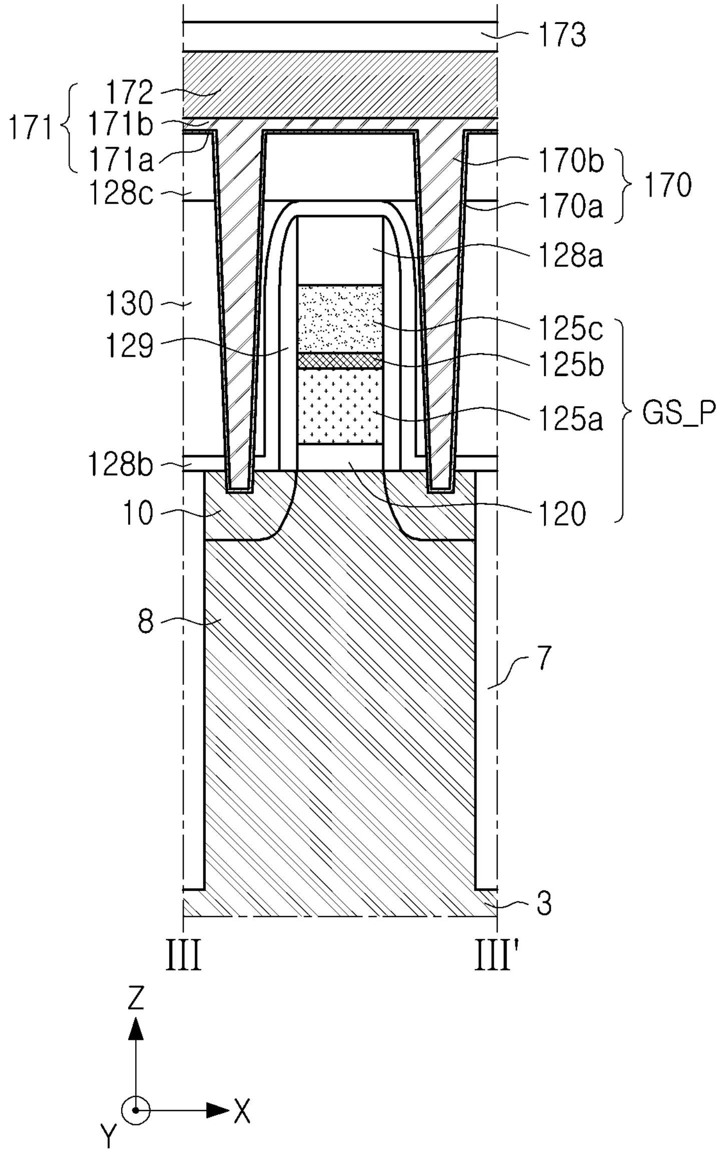

Referring to FIGS. 12A and 12B, a portion of the sacrificial layer SA may be removed by an anisotropic etching process. For example, a portion of the sacrificial layer SA covering the upper surface of the lower insulating pattern 73 and the upper surface of the upper insulating layer 173 may be removed. The etched sacrificial layer SA may cover the side surface of the conductive pattern CP.

Figure 13A:
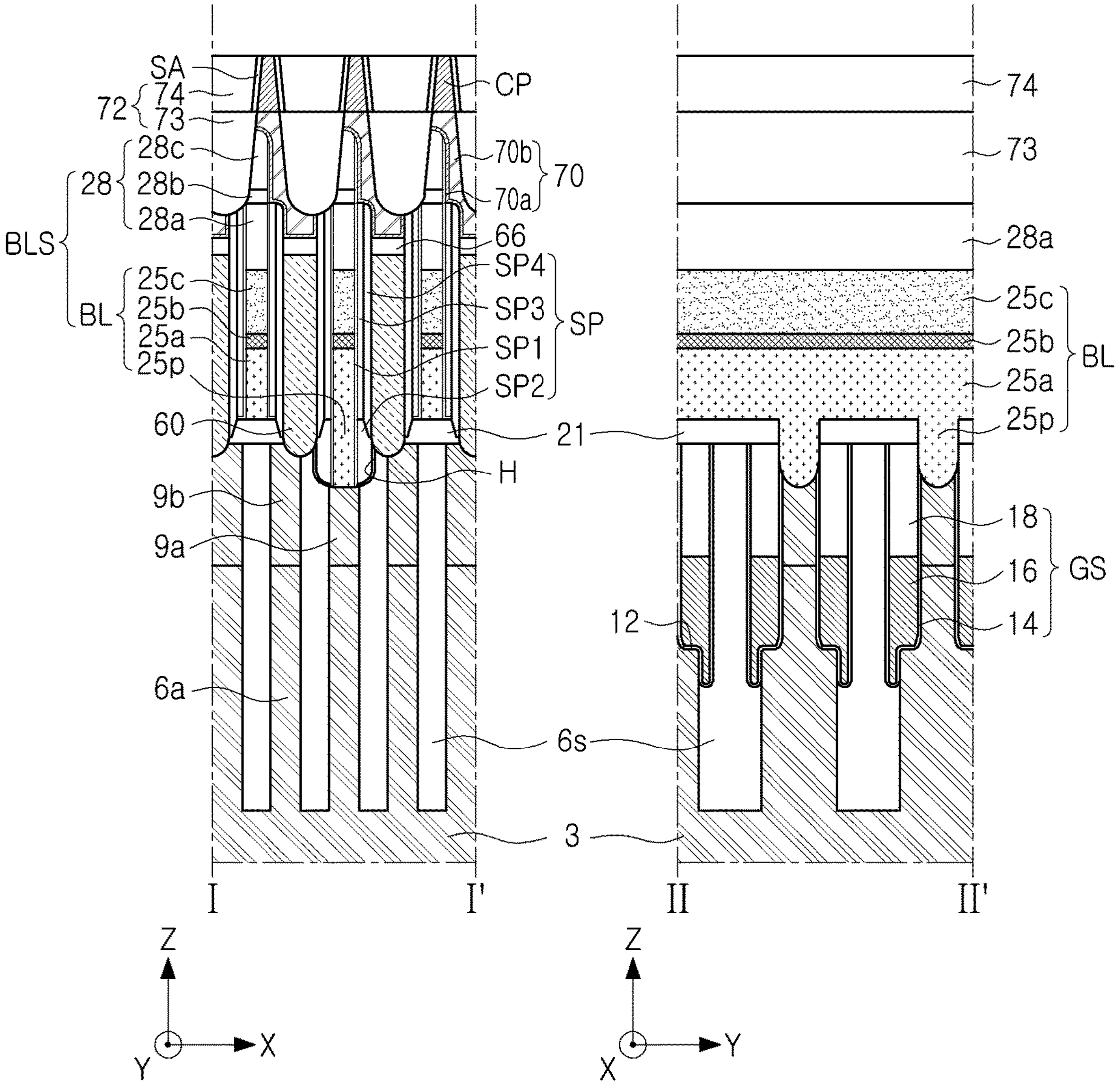
Figure 13B:
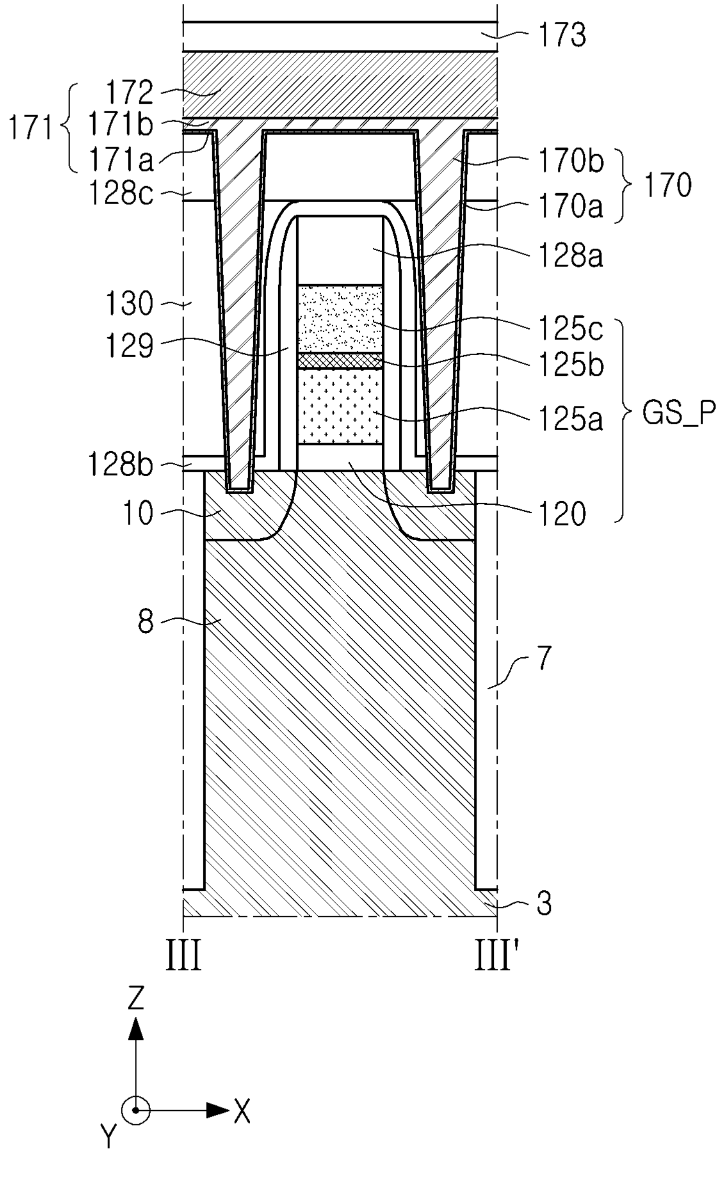

Referring to FIGS. 13A and 13B, an upper insulating pattern 74 may be formed on a lower insulating pattern 73 in the cell region CA. The upper insulating pattern 74 may be formed by forming an insulating material to cover the lower insulating pattern 73, the sacrificial layer SA and the conductive pattern CP, and etching the insulating material to expose the conductive pattern CP. For example, the insulating material may be etched by a planarization process. The upper surface of the upper insulating pattern 74 may be coplanar with the upper surface of the conductive pattern CP, but embodiments are not limited thereto. In some embodiments, the upper surface of the upper insulating pattern 74 may be disposed at a level lower than a level of the upper surface of the conductive pattern CP. The upper insulating pattern 74 and the lower insulating pattern 73 may form an insulating pattern structure 72.

In the peripheral circuit region PA, the insulating material may be formed on the upper insulating layer 173 resulting in a thickened upper insulating layer 173 and the thickened upper insulating layer 173 may have a portion removed by the etching process. The resulting upper insulating layer 173 in FIG. 13B may have the same vertical thickness as that of the upper insulating layer 173 in FIG. 12B, but embodiments are not limited thereto. In some embodiments, the upper insulating layer 173 in FIG. 13B may have a thickness greater or less than that of the upper insulating layer 173 in FIG. 12B.

Figure 14A:
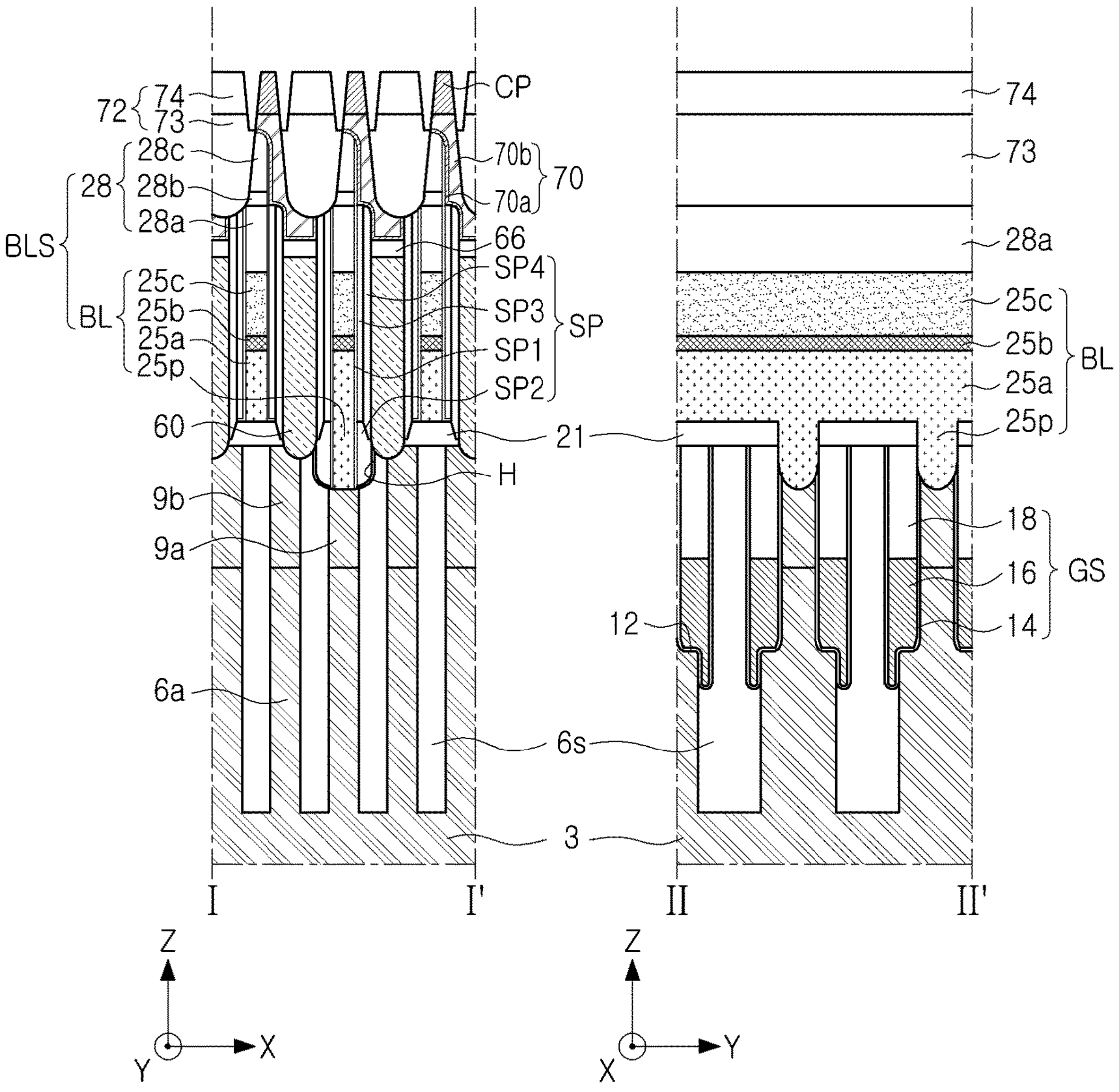
Figure 14B:
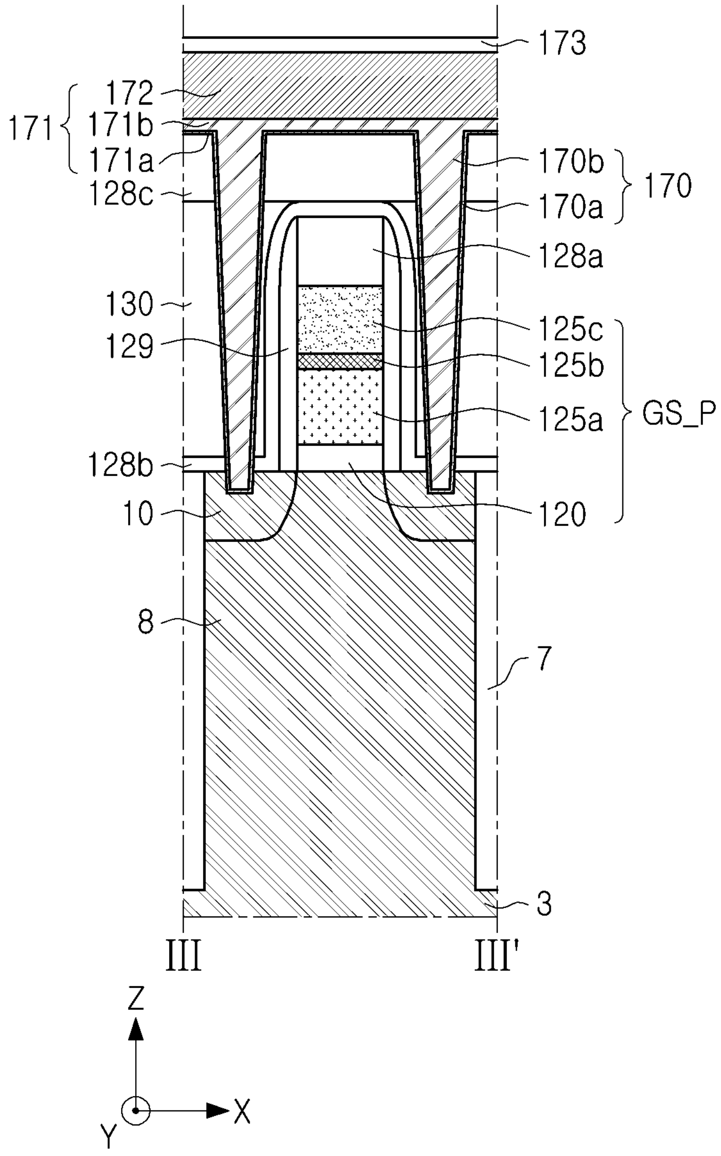

Referring to FIGS. 14A and 14B, the sacrificial layer SA may be removed from the cell region CA, and a side surface of the conductive pattern CP may be exposed. The sacrificial layer SA may be selectively removed by, for example, a wet etching process. After the sacrificial layer SA is removed, an etching process may be performed to expose the metal layer 70*b*. An upper portion of the lower insulating pattern 73 may be partially removed by the etching process, and a distance between the upper insulating pattern 74 and the conductive pattern CP may increase at higher levels. For example, a horizontal width of the upper insulating pattern 74 may decrease upwardly. In some embodiments, a vertical thickness of the conductive pattern CP and the upper insulating pattern 74 may be reduced by the etching process.

A vertical thickness of the upper insulating layer 173 may be reduced by an etching process in the peripheral region.

Figure 15A:
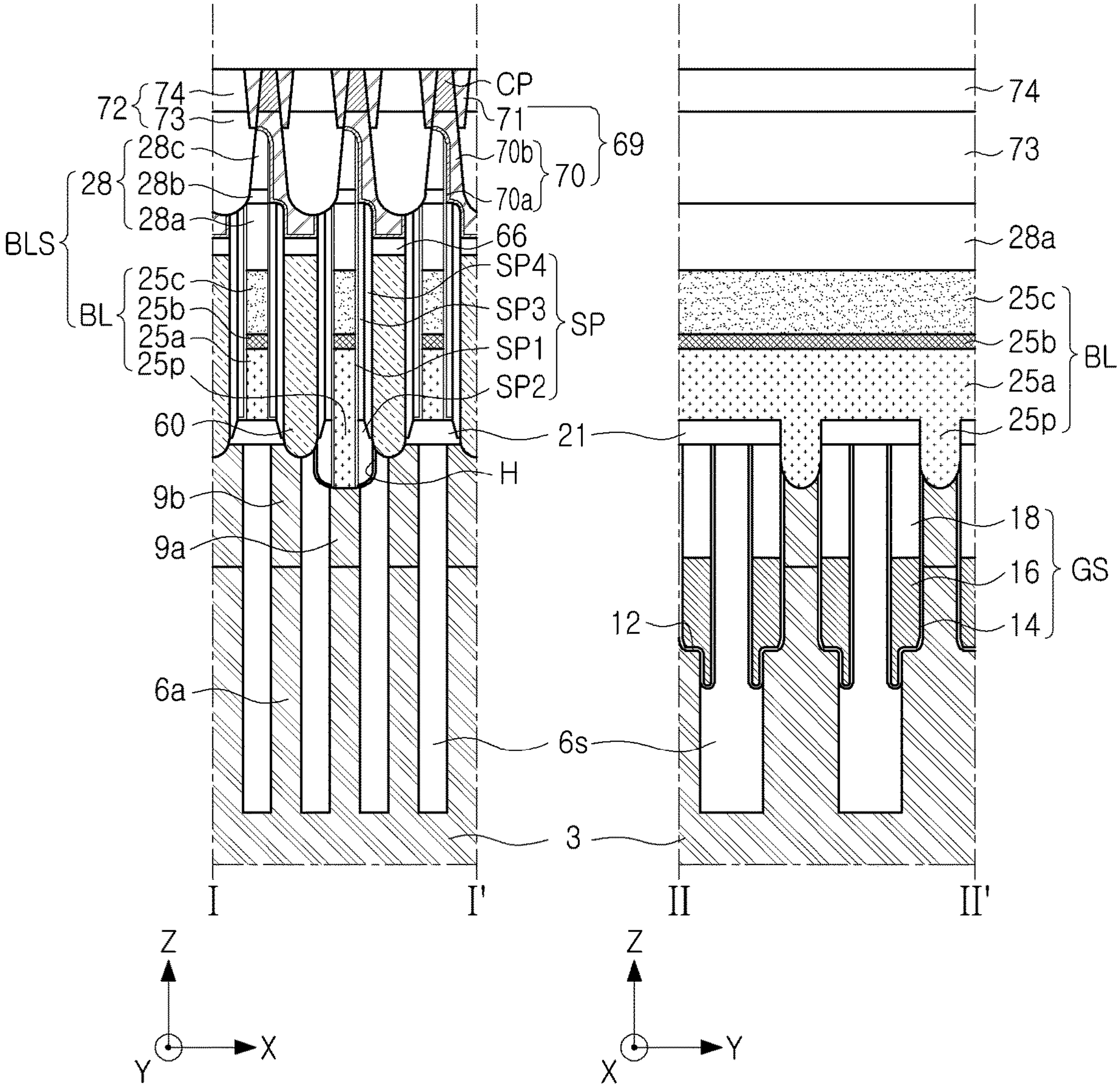
Figure 15B:
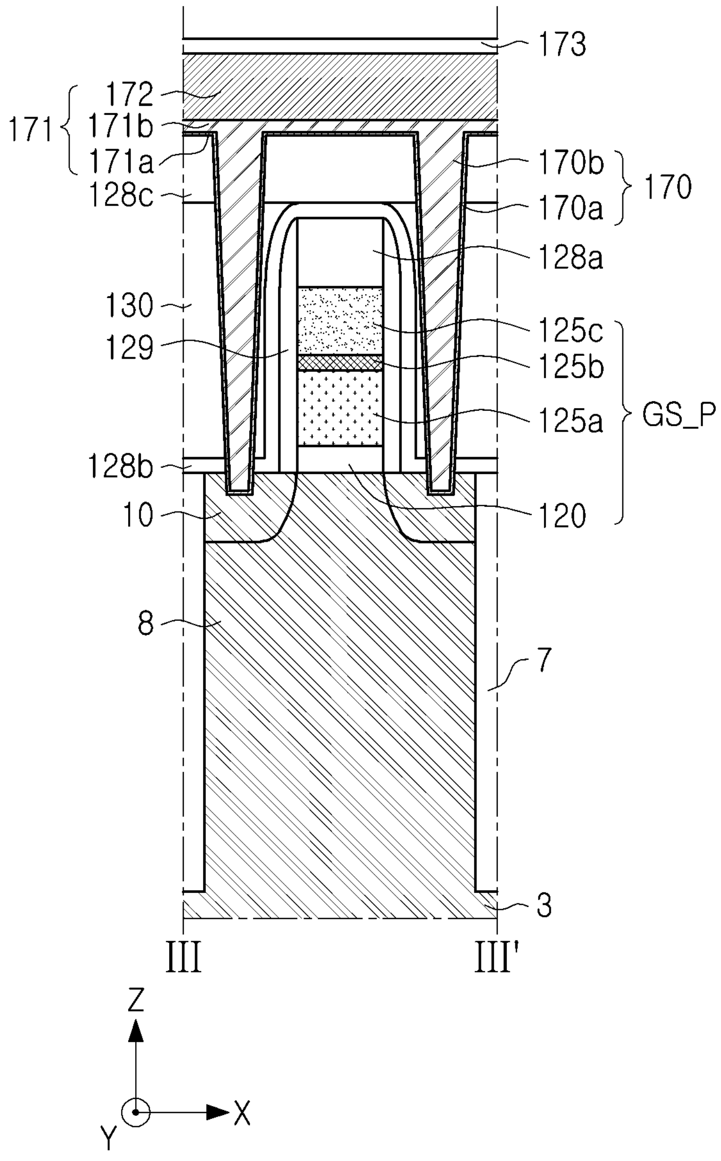

Referring to FIGS. 15A and 15B, an upper landing pad 71 may be formed in the cell region CA. The upper landing pad 71 and the lower landing pad 70 may together form the landing pad structure 69. The upper landing pad 71 may be formed by forming a conductive material to fill the space from which the sacrificial layer SA is removed and to cover the upper insulating pattern 74, and etching the conductive material to expose the upper surface of the conductive pattern CP. In some embodiments, the process of forming the conductive material may include a CVD method. The process of etching the conductive material may include at least one of an etch-back process and a chemical mechanical polishing (CMP) process. During the etch-back process, the conductive material forming the upper landing pad 71 may be selectively etched, and the conductive pattern CP may not be etched. The upper surface of the upper landing pad 71 may be coplanar with the upper surface of the conductive pattern CP, but embodiments are not limited thereto. In some embodiments, the upper surface of the upper landing pad 71 may be disposed at a level lower than a level of the conductive pattern CP.

The conductive material may be formed on the upper insulating layer 173 in the peripheral region, but a portion of the conductive material covering the upper insulating layer 173 may be removed by the etching process.

Referring back to FIGS. 3A and 3B, an etch stop layer 75 and a capacitor structure 80 may be formed on the landing pad structure 69 and the insulating pattern structure 72 in the cell region CA. The etch stop layer 75 may be formed to cover the upper surface of the landing pad structure 69 and the upper insulating pattern 74. The capacitor structure 80 may include a lower electrode 82 connected to the landing pad structure 69 and the conductive pattern CP through the etch stop layer 75, a capacitor dielectric layer 84 on the lower electrode 82, and an upper electrode 86 on the capacitor dielectric layer 84.

The lower electrode 82 may be manufactured by forming a barrier liner 81 on the landing pad structure 69 and a metal layer 82*b* on the barrier liner 81. The barrier liner 81 may be in contact with the upper landing pad 71 and the conductive pattern CP, and the barrier liner 81 and the conductive pattern CP may form the barrier layer 82*a* of the lower electrode 82. That is, the conductive pattern CP may be electrically connected to the barrier liner 81 and may function as the lower electrode 82.

In the peripheral circuit region PA, a peripheral insulating pattern 175 may be formed to penetrate through the upper insulating layer 173, through the peripheral wiring layer 171, and into the third insulating layer 128*c*. The peripheral insulating pattern 175 may be formed by creating a trench by removing a portion of the upper insulating layer 173, the peripheral wiring layer 171, and the third insulating layer 128*c* and filling the resulting trench with an insulating material such as silicon nitride. A second interlayer insulating layer ILD may be formed on the peripheral insulating pattern 175 and the peripheral insulating pattern 175 penetrating through the upper insulating layer 173 and the peripheral wiring layer 171, thereby manufacturing the semiconductor device 100. The peripheral insulating pattern 175 may electrically isolate portions of the peripheral wiring layer 171 from each other. The second interlayer insulating layer ILD may cover the upper insulating layer 173 and the peripheral insulating patterns 175.

Figure 16A:
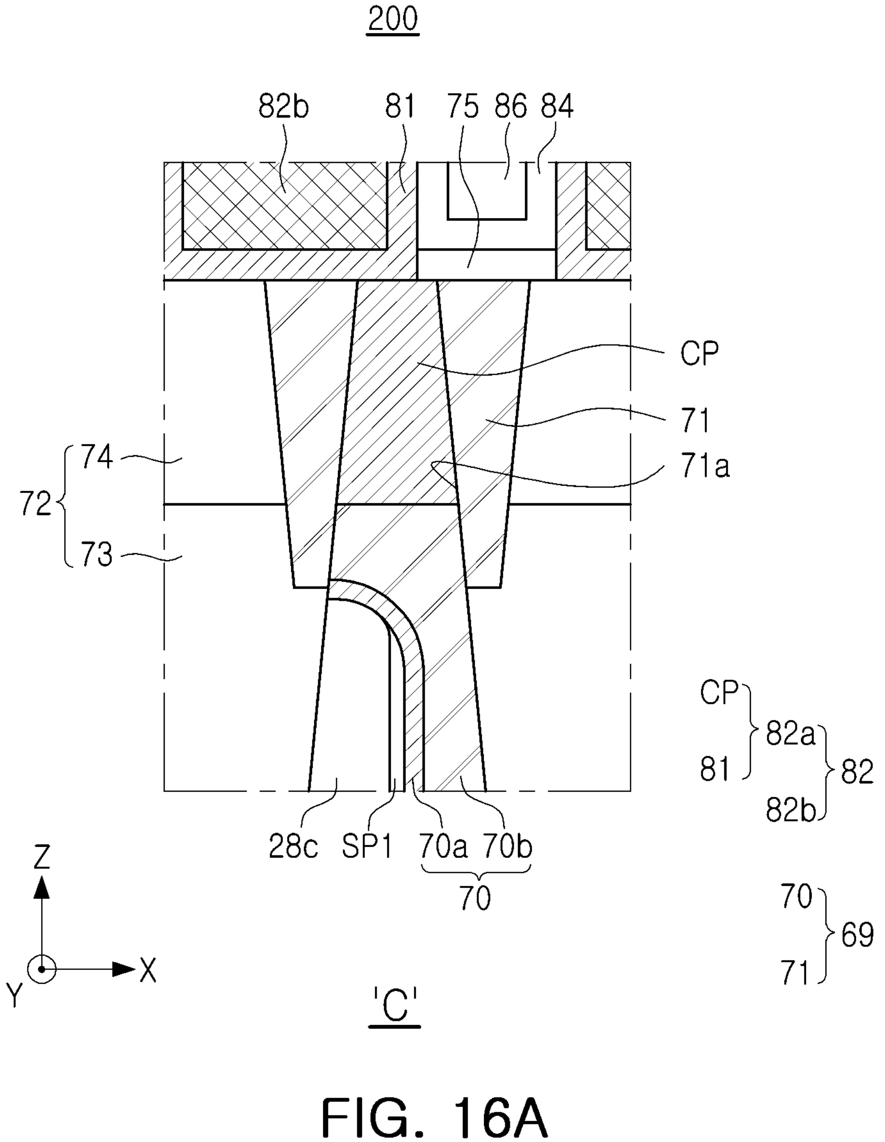
FIGS. 16A to 16I are vertical cross-sectional views illustrating a semiconductor device according to example embodiments of the present disclosure.

FIGS. 16A to 16I are vertical cross-sectional views illustrating details of a landing pad of a semiconductor device according to an example embodiment. FIG. 16A corresponds to detailed view C of FIG. 3A.

Referring to FIG. 16A, the semiconductor device 200 may include a landing pad structure 69 electrically connected to a lower electrode 82. In some embodiments, the metal layer of the lower electrode 82 may be shifted from the upper landing pad 71. For example, the barrier liner 81 may be in contact with the upper insulating pattern 74, and the etch stop layer 75 may be in contact with the upper landing pad 71 and the conductive pattern CP. However, as described above, since the conductive pattern CP working as the lower electrode 82 is disposed in the upper landing pad 71, the lower electrode 82 may have a contact area with the landing pad structure 69 that is as much as the area of a side surface and a lower surface of the conductive pattern CP. Accordingly, even when the metal layer of the lower electrode 82 is shifted from the upper landing pad 71, an increase in contact resistance between the lower electrode 82 and the landing pad structure 69 may be prevented.

Figure 16B:
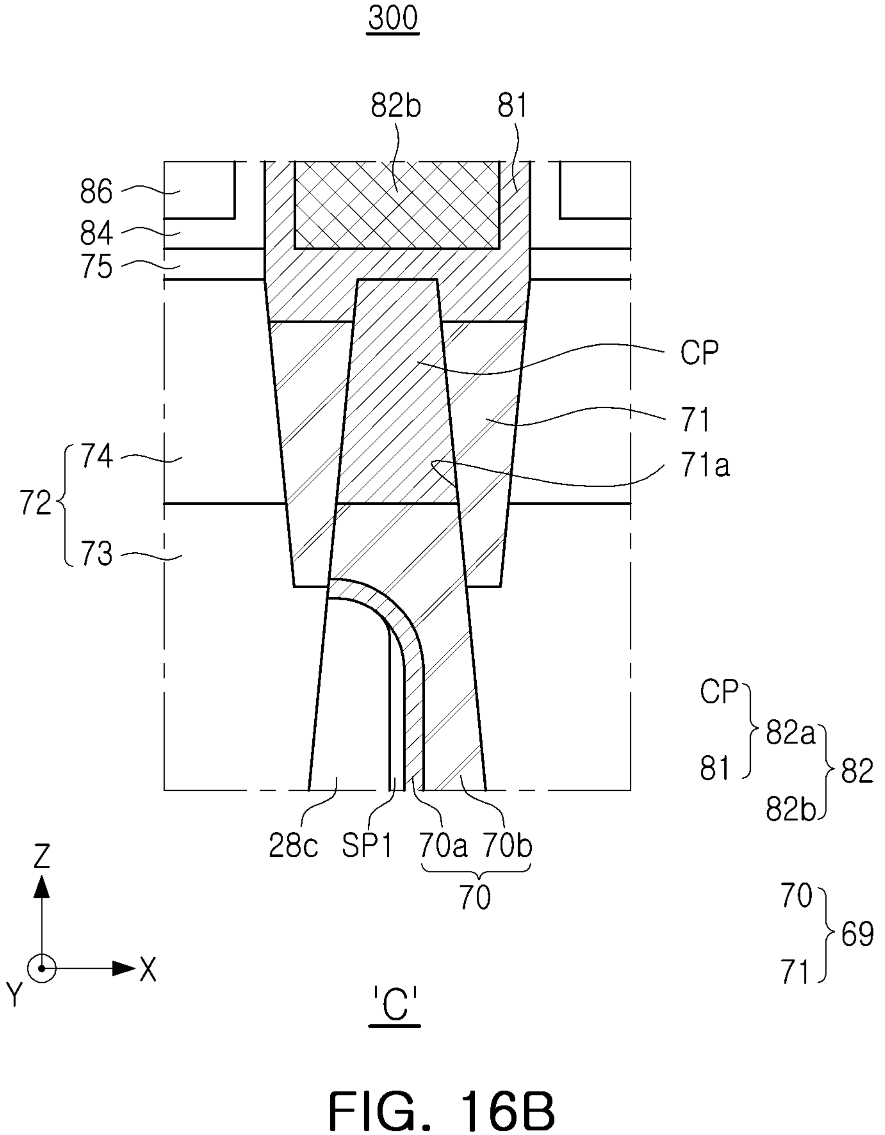

Referring to FIG. 16B, a semiconductor device 300 may include a landing pad structure 69 electrically connected to the lower electrode 82. Since the upper landing pad 71 may include a material having selectivity with the conductive pattern CP, in the process of manufacturing the upper landing pad 71 described with reference to FIG. 15A, the upper landing pad 71 may be more etched than the conductive pattern CP. The upper surface of the upper landing pad 71 may be disposed on a level lower than a level of the upper surface of the conductive pattern CP, and the conductive pattern CP may protrude from the upper surface of the upper landing pad 71.

The barrier liner 81 of the lower electrode 82 may be in contact with the upper surface of the upper landing pad 71 and may partially be in contact with the side surface of the conductive pattern CP. The lower end of the barrier liner 81 may be disposed on a level lower than a level of the upper surface of the conductive pattern CP.

Figure 16C:
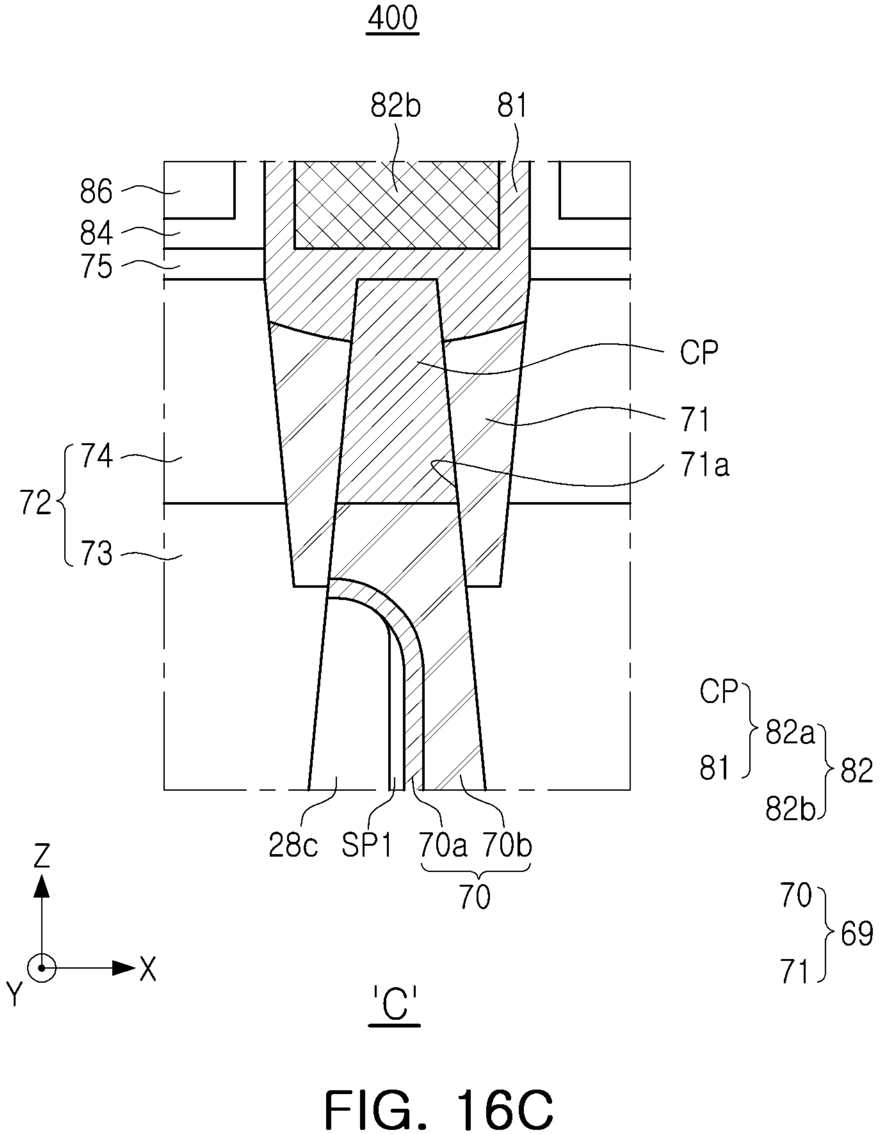

Referring to FIG. 16C, a semiconductor device 400 may include a landing pad structure 69 electrically connected to a lower electrode 82. In some embodiments, an upper surface of the upper landing pad 71 may be an upwardly curved surface (e.g., a concave external surface facing upward). A vertical thickness of the upper landing pad 71 may increase in a direction away from the conductive pattern CP.

The barrier liner 81 of the lower electrode 82 may be in contact with the upper surface of the upper landing pad 71 and may be partially in contact with the side surface of the conductive pattern CP. The lower end of the barrier liner 81 may be disposed on a level lower than a level of the upper surface of the conductive pattern CP.

Figure 16D:
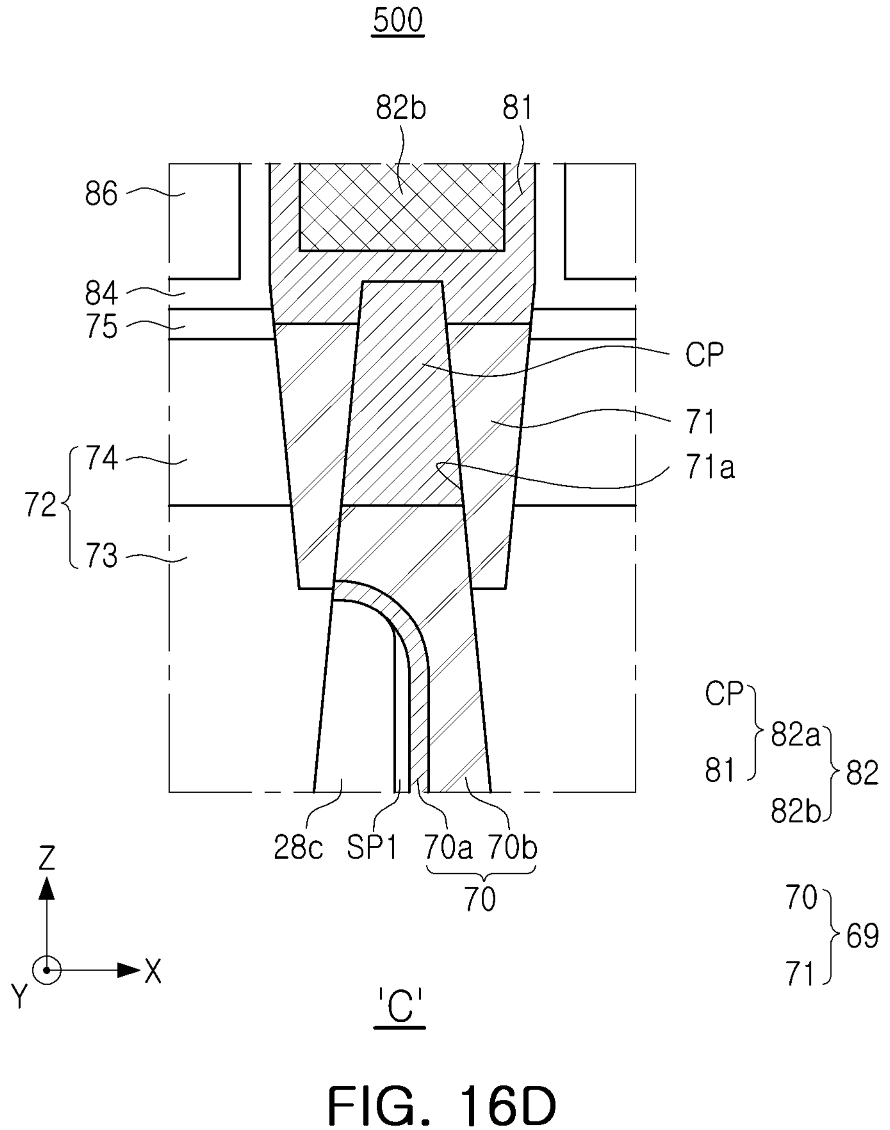

Referring to FIG. 16D, a semiconductor device 500 may include a landing pad structure 69 electrically connected to a lower electrode 82. In the manufacturing process of the upper landing pad 71 described with reference to FIG. 15A, the CMP process may be performed. The upper insulating pattern 74 may be more etched than the upper landing pad 71 and the conductive pattern CP. An upper surface of the upper insulating pattern 74 may be disposed at a level lower than a level of an upper surface of the upper landing pad 71. An upper surface of the upper landing pad 71 may be disposed at a level lower than a level of the upper surface of the conductive pattern CP, and the conductive pattern CP may protrude from the upper surface of the upper landing pad 71.

Figure 16E:
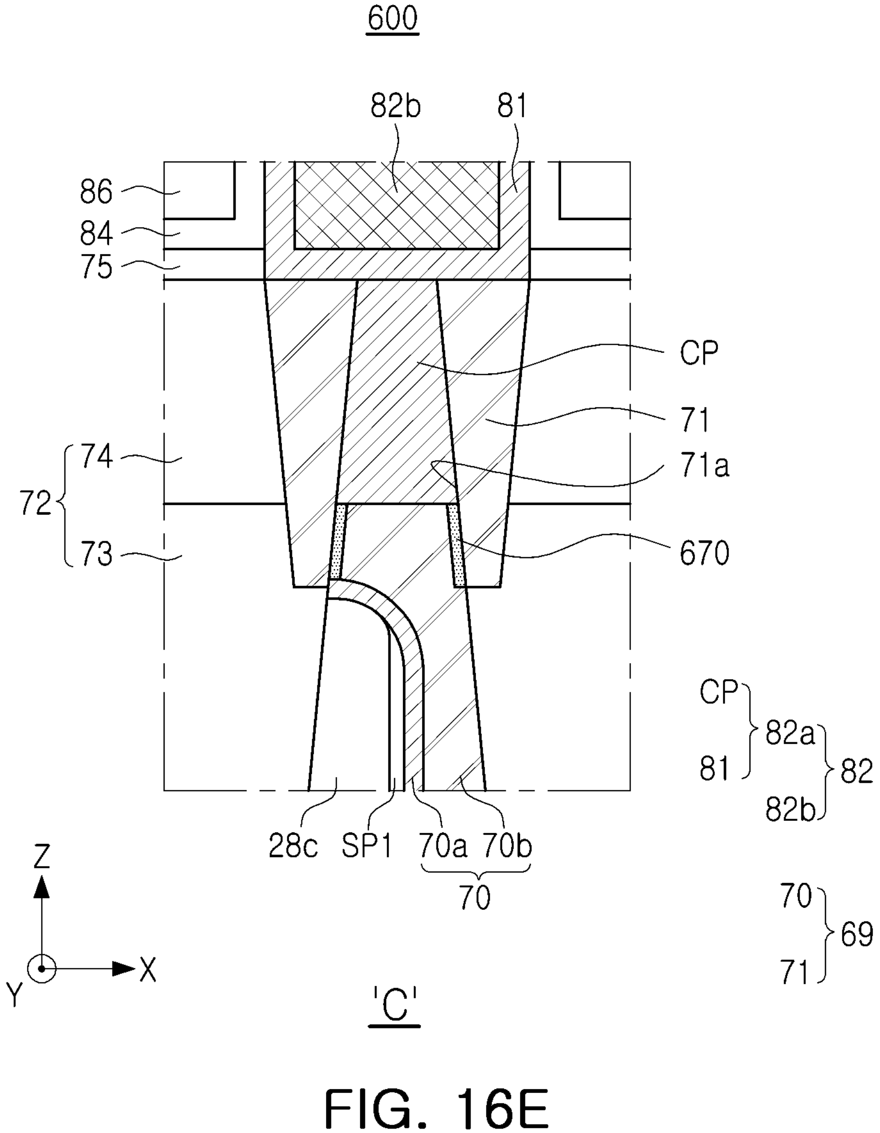

Referring to FIG. 16E, a semiconductor device 600 may include a landing pad structure 69 electrically connected to a lower electrode 82. In some embodiments, the semiconductor device 600 may further include a metal oxide layer 670 between the lower landing pad 70 and the upper landing pad 71. In the process described with reference to FIG. 14A, an upper portion of the lower landing pad 70 may be exposed, and a portion of the exposed lower landing pad 70 may be oxidized such that a metal oxide layer 670 may be formed. The metal oxide layer 670 may be in contact with the side surface of the lower landing pad 70, the side surface of the upper landing pad 71, and the lower surface of the conductive pattern CP. The metal oxide layer 670 may extend in a horizontal direction and may have a cylindrical ring shape in a horizontal plane such as when viewed in a plan view.

Figure 16F:
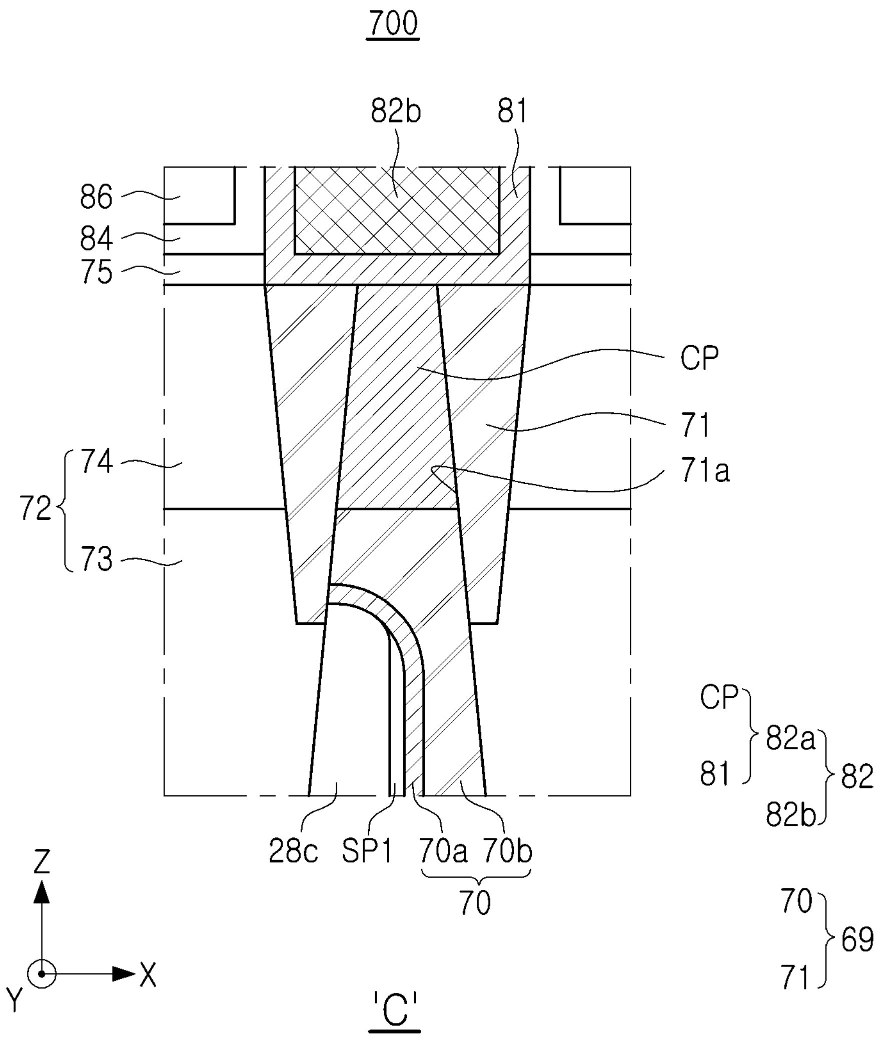

Referring to FIG. 16F, a semiconductor device 700 may include a landing pad structure 69 electrically connected to a lower electrode 82. In some embodiments, a lower surface of the upper landing pad 71 may be disposed at a level lower than a level of an upper end of the bitline structure BLS. For example, the lower surface of the upper landing pad 71 may be disposed on a level lower than a level of an upper end of the third capping layer 28*c*. The upper landing pad 71 may be in contact with the third capping layer 28*c*, the barrier layer 70*a* and the metal layer 70*b*.

Figure 16G:
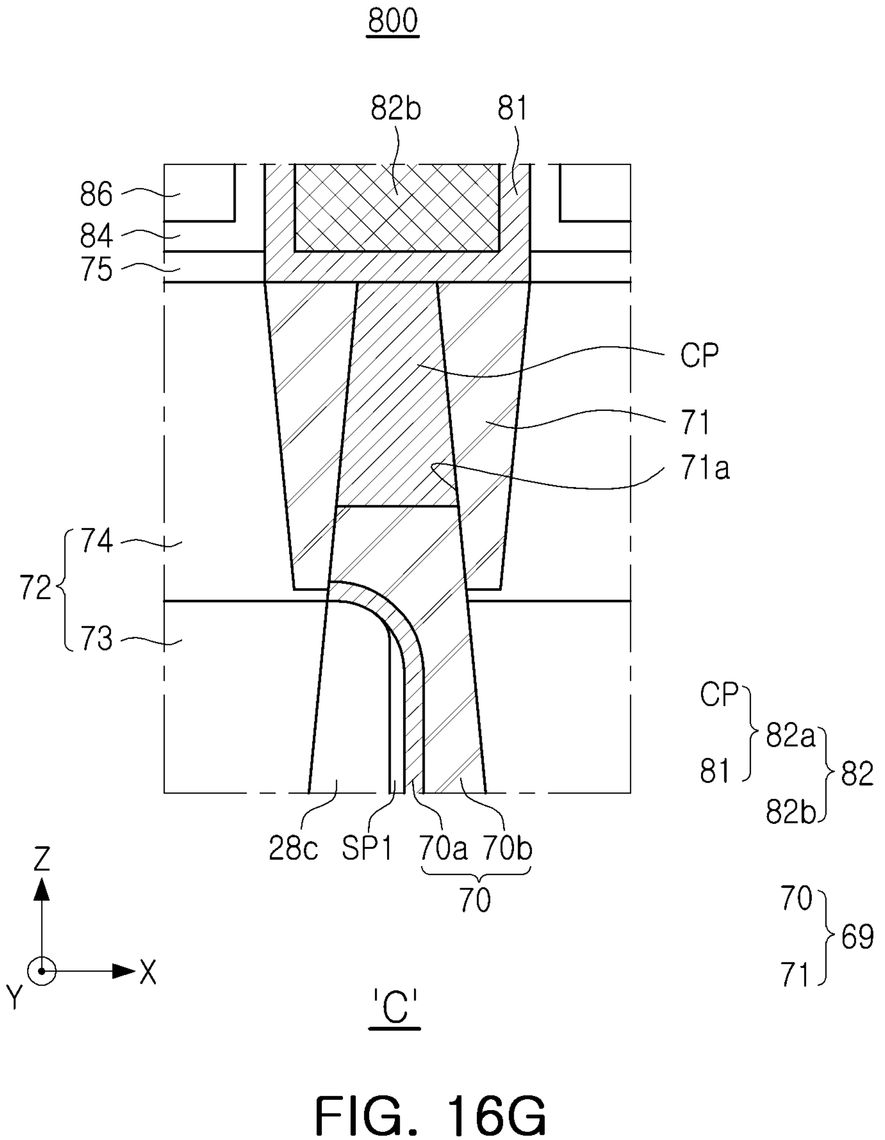

Referring to FIG. 16G, the semiconductor device 800 may include an insulating pattern structure 72 in contact with the landing pad structure 69. In some embodiments, an upper surface of the lower insulating pattern 73 may be disposed on a level lower than a level of an upper surface of the lower landing pad 70 and may be spaced apart from the upper landing pad 71.

Figure 16H:
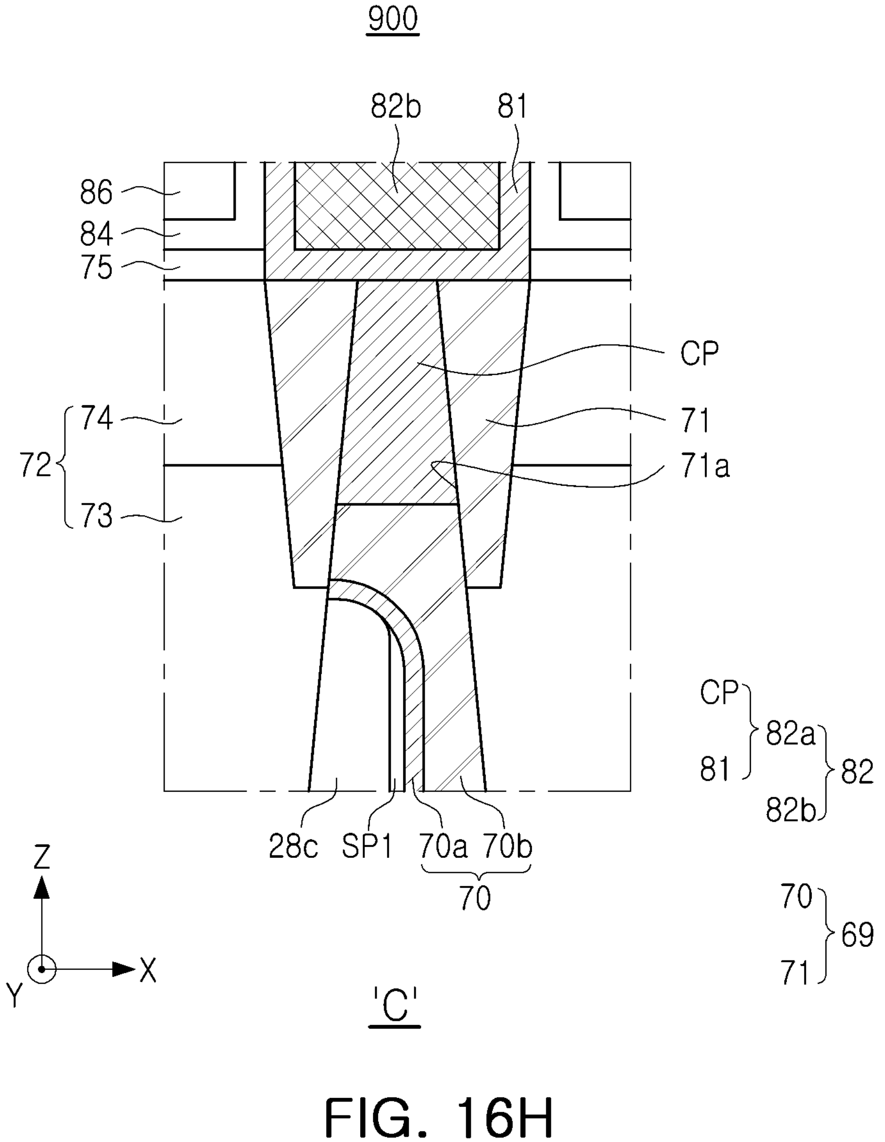

Referring to FIG. 16H, a semiconductor device 900 may include an insulating pattern structure 72 in contact with a landing pad structure 69. In some embodiments, an upper surface of the lower insulating pattern 73 may be disposed on a level higher than a level of an upper surface of the lower landing pad 70.

Figure 16I:
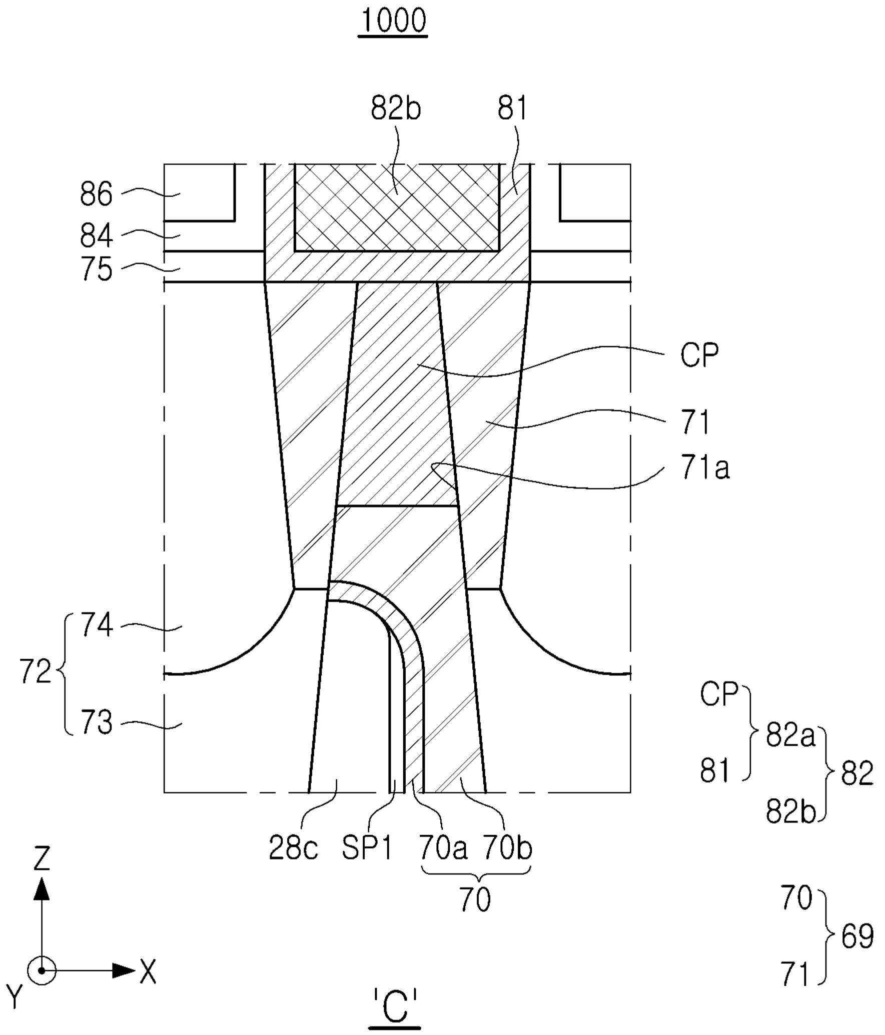

Referring to FIG. 16I, a semiconductor device 1000 may include an insulating pattern structure 72 in contact with a landing pad structure 69. In some embodiments, an upper surface of the lower insulating pattern 73 may be an upwardly curved surface (e.g., have an upward facing concave surface). A lower surface of the upper insulating pattern 74 may be a downwardly curved surface (e.g., have a downward facing convex surface).

According to the aforementioned example embodiments, the contact area between the landing pad and the lower electrode may be increased using the side surface and lower surface of the conductive pattern and contact resistance between the lower electrode and the landing pad may be reduced.

Also, the upper landing pad has a structure with an upper surface that is wider than a lower surface and contact resistance between the lower electrode and the landing pad may be reduced.

While the inventive concept has been illustrated and described above through the use of example embodiments, it will be apparent to those skilled in the art that modifications and variations may be made to the example embodiments without departing from the scope of the inventive concept as defined by the appended claims.

What is claimed is:

1. A semiconductor device, comprising:

a substrate including an active region;

a cell gate structure disposed in the substrate, crossing the active region, and extending in a first horizontal direction;

bitline structures crossing the cell gate structure and extending in a second horizontal direction intersecting the first horizontal direction;

a contact plug disposed between the bitline structures;

a landing pad structure disposed on the contact plug and including a lower landing pad and an upper landing pad on the lower landing pad, the upper landing pad including a cavity;

a conductive pattern disposed in the cavity of the upper landing pad; and an insulating pattern structure in contact with one of the bitline structures and in contact with the landing pad structure.

2. The semiconductor device of claim 1, wherein the upper landing pad has an upper surface wider than a lower surface of the upper landing pad.

3. The semiconductor device of claim 1, wherein a horizontal width of the cavity decreases upwardly.

4. The semiconductor device of claim 1, wherein a portion of an internal surface of the upper landing pad is in contact with a portion of a side surface of the lower landing pad.

5. The semiconductor device of claim 1, wherein the conductive pattern is in contact with an upper surface of the lower landing pad and an internal side surface of the upper landing pad.

6. The semiconductor device of claim 1, wherein a portion of the lower landing pad is disposed in the cavity.

7. The semiconductor device of claim 1, wherein the conductive pattern is formed of a material different from a material the upper landing pad is formed of.

8. The semiconductor device of claim 1, wherein a lower surface of the upper landing pad is disposed at a level lower than a level of an upper surface of the lower landing pad.

9. The semiconductor device of claim 1, wherein an upper surface of the upper landing pad is disposed at a level lower than a level of an upper surface of the conductive pattern.

10. The semiconductor device of claim 1, wherein an upper surface of the upper landing pad is a curved surface, and wherein a vertical thickness of the upper landing pad increases in a direction away from the conductive pattern.

11. The semiconductor device of claim 1, wherein the insulating pattern structure includes:

a lower insulating pattern in contact with the lower landing pad; and an upper insulating pattern in contact with the upper landing pad.

12. The semiconductor device of claim 11, wherein an upper surface of the upper insulating pattern is disposed at the same level as a level of an upper surface of the conductive pattern.

13. The semiconductor device of claim 11, wherein an upper surface of the upper insulating pattern is disposed on a level lower than a level of an upper surface of the upper landing pad.

14. The semiconductor device of claim 11, further comprising:

a metal oxide layer disposed between a side surface of the lower landing pad and an internal side surface of the upper landing pad.

15. A semiconductor device, comprising:

a substrate including an active region;

a cell gate structure disposed in the substrate, crossing the active region, and extending in a first horizontal direction;

bitline structures crossing the cell gate structure and extending in a second horizontal direction intersecting the first horizontal direction;

a contact plug disposed between the bitline structures;

a landing pad structure disposed on the contact plug and including a lower landing pad and an upper landing pad on the lower landing pad, the upper landing pad including a cavity;

an insulating pattern structure in contact with one of the bitline structures and in contact with the landing pad structure; and a capacitor structure including a lower electrode disposed on the landing pad structure and electrically connected to the landing pad structure, a capacitor dielectric layer on the lower electrode, and an upper electrode on the capacitor dielectric layer, wherein a portion of the lower electrode extends into the cavity of the upper landing pad.

16. The semiconductor device of claim 15, wherein the lower electrode includes:

a conductive pattern disposed in the cavity;

a barrier liner in contact with an upper surface of the upper landing pad and an upper surface of the conductive pattern; and a metal layer on the barrier liner.

17. The semiconductor device of claim 16, wherein a lower end of the barrier liner is disposed on a level lower than a level of the upper surface of the conductive pattern.

18. A semiconductor device, comprising:

a substrate including a cell region and a peripheral circuit region;

a first active region disposed on the substrate in the cell region;

a second active region disposed on the substrate in the peripheral circuit region;

a cell gate structure disposed in the substrate in the cell region, crossing the first active region, and extending in a first horizontal direction;

bitline structures crossing the cell gate structure and extending in a second horizontal direction intersecting the first horizontal direction;

a contact plug disposed between the bitline structures;

a landing pad structure disposed on the contact plug and including a lower landing pad and an upper landing pad on the lower landing pad, the upper landing pad including a cavity;

a conductive pattern disposed in the cavity of the upper landing pad;

a peripheral gate structure disposed on the substrate in the peripheral circuit region;

a peripheral contact plug adjacent to the peripheral gate structure and connected to the second active region; and a peripheral wiring layer on the peripheral contact plug.

19. The semiconductor device of claim 18, wherein the peripheral wiring layer includes a barrier layer, a metal layer and a conductive layer stacked in sequence, and wherein the conductive layer and the conductive pattern have the same material composition.

20. The semiconductor device of claim 19, wherein a vertical thickness of the conductive layer is greater than a vertical thickness of the conductive pattern.

* * * * *